(12) United States Patent
Huang et al.

(10) Patent No.: US 12,446,303 B2
(45) Date of Patent: *Oct. 14, 2025

(54) STACKING CMOS STRUCTURE

(71) Applicant: Taiwan Semiconductor Manufacturing Co., Ltd., Hsinchu (TW)

(72) Inventors: Yu-Xuan Huang, Hsinchu (TW); Chia-En Huang, Hsinchu County (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/672,936

(22) Filed: May 23, 2024

(65) Prior Publication Data
US 2024/0312995 A1     Sep. 19, 2024

Related U.S. Application Data

(63) Continuation of application No. 17/116,552, filed on Dec. 9, 2020, now Pat. No. 11,996,409.
(Continued)

(51) Int. Cl.
*H01L 27/092* (2006.01)
*H01L 21/8238* (2006.01)
(Continued)

(52) U.S. Cl.
CPC ......... *H10D 84/85* (2025.01); *H01L 23/5286* (2013.01); *H10D 30/6735* (2025.01);
(Continued)

(58) Field of Classification Search
CPC ............. H10D 30/014; H10D 30/6219; H10D 30/6713; H10D 30/6735; H10D 30/797;
(Continued)

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai | |

(Continued)

FOREIGN PATENT DOCUMENTS

| | | |
|---|---|---|
| CN | 109427775 A | 3/2019 |
| CN | 109801968 A | 5/2019 |

(Continued)

OTHER PUBLICATIONS

Chen, Chun-Yuan et al., "Semiconductor Devices with Backside Air Gap Dielectric", U.S. Appl. No. 16/888,217, filed May 29, 2020, Assignee Taiwan Semiconductor Manufacturing Co., Ltd., 26 pages specification, 16 pages drawings.
(Continued)

*Primary Examiner* — David C Spalla
(74) *Attorney, Agent, or Firm* — Haynes and Boone, LLP

(57) ABSTRACT

A semiconductor structure includes a power rail, a first source/drain feature disposed over the power rail, a via connecting the power rail to the first source/drain feature; an isolation feature disposed over the first source/drain feature, and a second source/drain feature disposed over the isolation feature, where the first and the second source/drain features are of opposite conductivity types.

20 Claims, 34 Drawing Sheets

Related U.S. Application Data

(60) Provisional application No. 63/027,811, filed on May 20, 2020.

(51) Int. Cl.
*H01L 23/528* (2006.01)
*H01L 29/06* (2006.01)
*H01L 29/423* (2006.01)
*H10D 30/67* (2025.01)
*H10D 62/10* (2025.01)
*H10D 84/01* (2025.01)
*H10D 84/03* (2025.01)
*H10D 84/85* (2025.01)

(52) U.S. Cl.
CPC ....... *H10D 62/118* (2025.01); *H10D 84/0188* (2025.01); *H10D 84/038* (2025.01)

(58) Field of Classification Search
CPC .. H10D 62/021; H10D 62/118; H10D 62/119; H10D 62/121; H10D 62/149; H10D 62/151; H10D 84/013; H10D 84/017; H10D 84/0188; H10D 84/038; H10D 84/85; H10L 23/5286
See application file for complete search history.

(56) References Cited

U.S. PATENT DOCUMENTS

| | | | |
|---|---|---|---|
| 8,802,504 | B1 | 8/2014 | Hou |
| 8,803,292 | B2 | 8/2014 | Chen |
| 8,803,316 | B2 | 8/2014 | Lin |
| 8,816,444 | B2 | 8/2014 | Wann |
| 8,823,065 | B2 | 9/2014 | Wang |
| 8,860,148 | B2 | 10/2014 | Hu |
| 8,993,380 | B2 | 3/2015 | Hou |
| 9,105,490 | B2 | 8/2015 | Wang |
| 9,236,267 | B2 | 1/2016 | De |
| 9,236,300 | B2 | 1/2016 | Liaw |
| 9,281,254 | B2 | 3/2016 | Yu |
| 9,299,649 | B2 | 3/2016 | Chiu |
| 9,372,206 | B2 | 6/2016 | Wu |
| 9,425,126 | B2 | 8/2016 | Kuo |
| 9,431,388 | B1 | 8/2016 | Gauthier, Jr. |
| 9,443,783 | B2 | 9/2016 | Lin |
| 9,496,189 | B2 | 11/2016 | Yu |
| 9,520,482 | B1 | 12/2016 | Chang |
| 9,576,814 | B2 | 2/2017 | Wu |
| 9,704,835 | B2 | 7/2017 | Fong |
| 9,711,555 | B2 | 7/2017 | Liu |
| 10,090,193 | B1 | 10/2018 | Chanemougame |
| 11,532,708 | B2 | 12/2022 | Liebmann |
| 11,996,409 | B2 * | 5/2024 | Huang ............... H10D 88/01 |
| 2016/0093726 | A1 | 3/2016 | Ching |
| 2019/0148376 | A1 | 5/2019 | Chanemougame |
| 2019/0214469 | A1 | 7/2019 | Paul |
| 2019/0319095 | A1 | 10/2019 | Zhang |
| 2019/0362978 | A1 | 11/2019 | Niebojewski |
| 2019/0393091 | A1 | 12/2019 | Cheng |
| 2020/0135646 | A1 | 4/2020 | Rubin |
| 2020/0294998 | A1 | 9/2020 | Lilak |
| 2021/0184000 | A1 * | 6/2021 | Ramaswamy ....... H10D 64/017 |
| 2021/0272904 | A1 | 9/2021 | Komuro |
| 2021/0313326 | A1 | 10/2021 | Lim |
| 2022/0045056 | A1 | 2/2022 | Wang |

FOREIGN PATENT DOCUMENTS

| | | |
|---|---|---|
| CN | 110556374 A | 12/2019 |
| KR | 20190036521 A | 4/2019 |
| TW | 202006887 A | 2/2020 |
| WO | 2020082405 A1 | 4/2020 |

OTHER PUBLICATIONS

Su, Huan-Chieh et al., "Backside Power Rail and Methods of Forming the Same", U.S. Appl. No. 16/901,963, filed Jun. 15, 2020, Assignee Taiwan Semiconductor Manufacturing Co., Ltd., 28 pages specification, 22 pages drawings.

Chen, Chun-Yuan et al., "Anchor-Shaped Backside Via and Method Thereof", U.S. Appl. No. 16/926,447, filed Jul. 10, 2020, Assignee Taiwan Semiconductor Manufacturing Co., Ltd., 32 pages specification, 16 pages drawings.

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering, University of Houston, Manuscript # JVSTA-A-14-332.

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

Chen, Hsin-Ping, et al., "Semiconductor Device with Conductors Embedded in a Substrate", U.S. Appl. No. 16/751,158, filed Jan. 24, 2020, Assignee: Taiwan Semiconductor Manufacturing Co., Ltd., 29 pages specification, 19 pages drawings.

Chiang, Kuo Cheng, et al., "Semiconductor Devices with Backside Power Rail and Backside Self-Aligned Via", U.S. Appl. No. 17/080,521, filed Oct. 25, 2020, Assignee: Taiwan Semiconductor Manufacturing Co., Ltd., 37 pages specification, 24 pages drawings.

Chu, Feng-Ching, et al., "Epitaxial Source/Drain Feature with Enlarged Lower Section Interfacing with Backside Via", U.S. Appl. No. 16/901,631, filed Jun. 14, 2020, Assignee: Taiwan Semiconductor Manufacturing Co., Ltd., 35 pages specification, 23 pages drawings.

Ryckaert J. et al.; The Complementary FET (CFET) for CMOS scaling beyond N3, 2018 Symposium on VLSI Technology Digest of Technical Papers, p. 141-142.

Ryckaert, J. et al.; Extending the roadmap beyond 3nm through system scaling boosters: A case study on Buried Power Rail and Backside Power Delivery, 2019 Electron Devices Technology and Manufacturing Conference (EDTM) pp. 50-52.

* cited by examiner

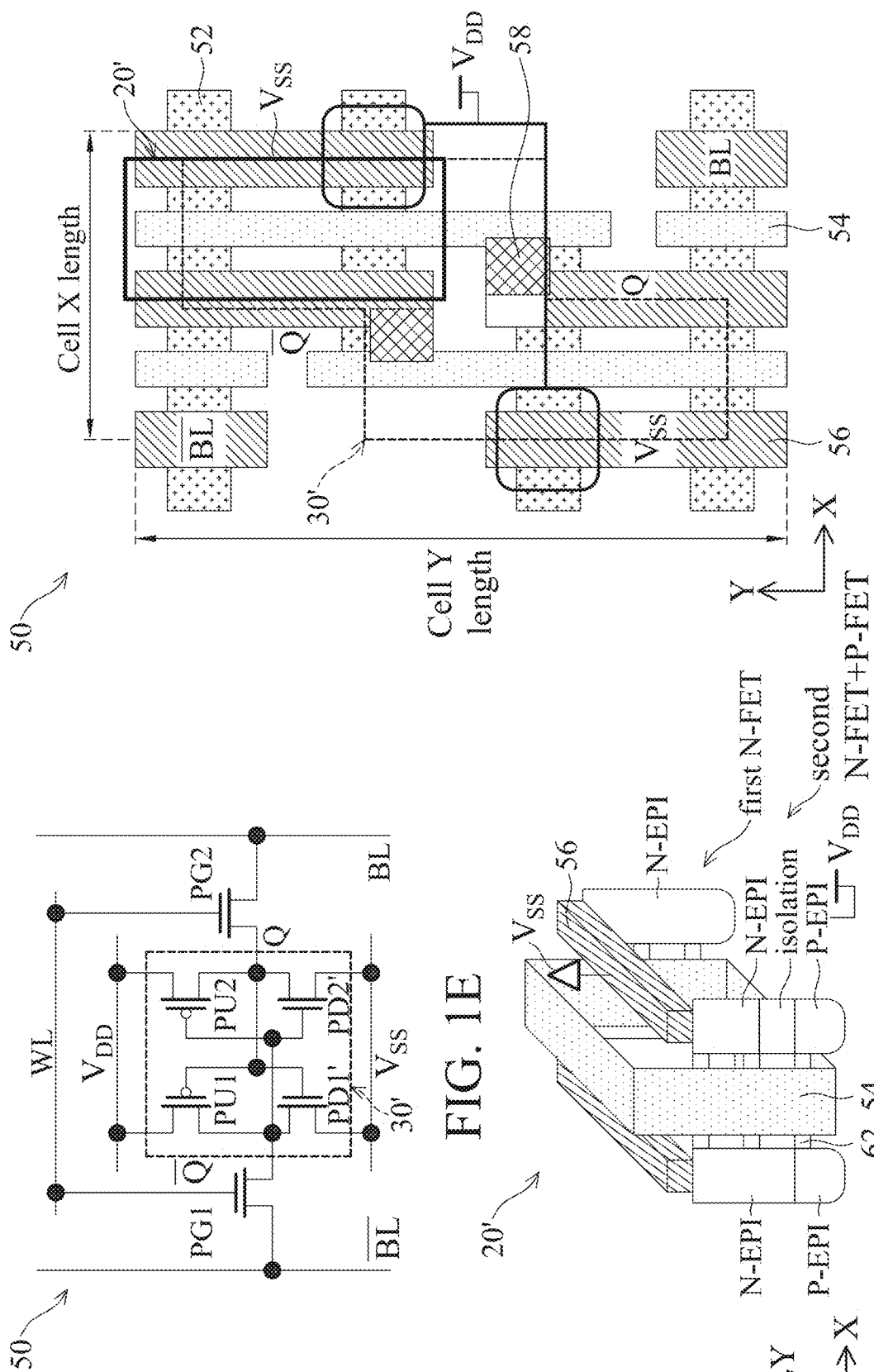

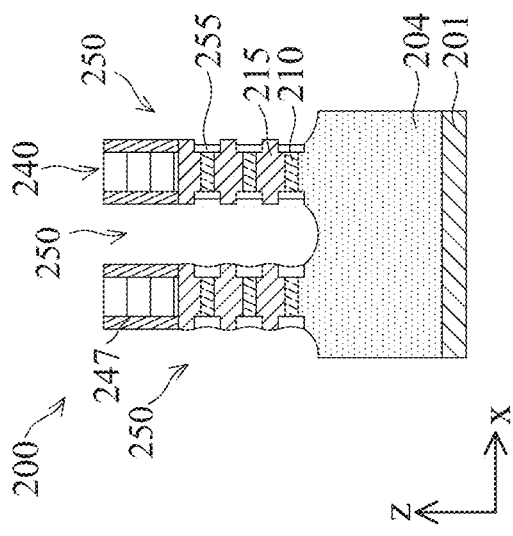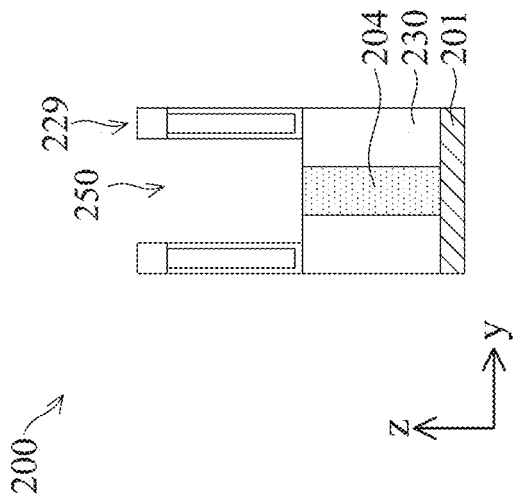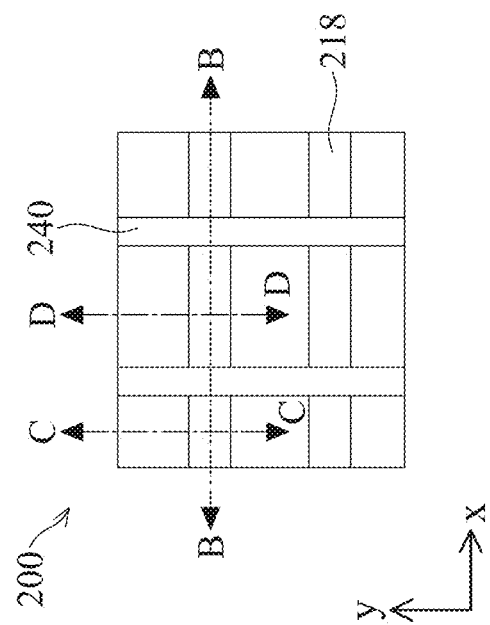

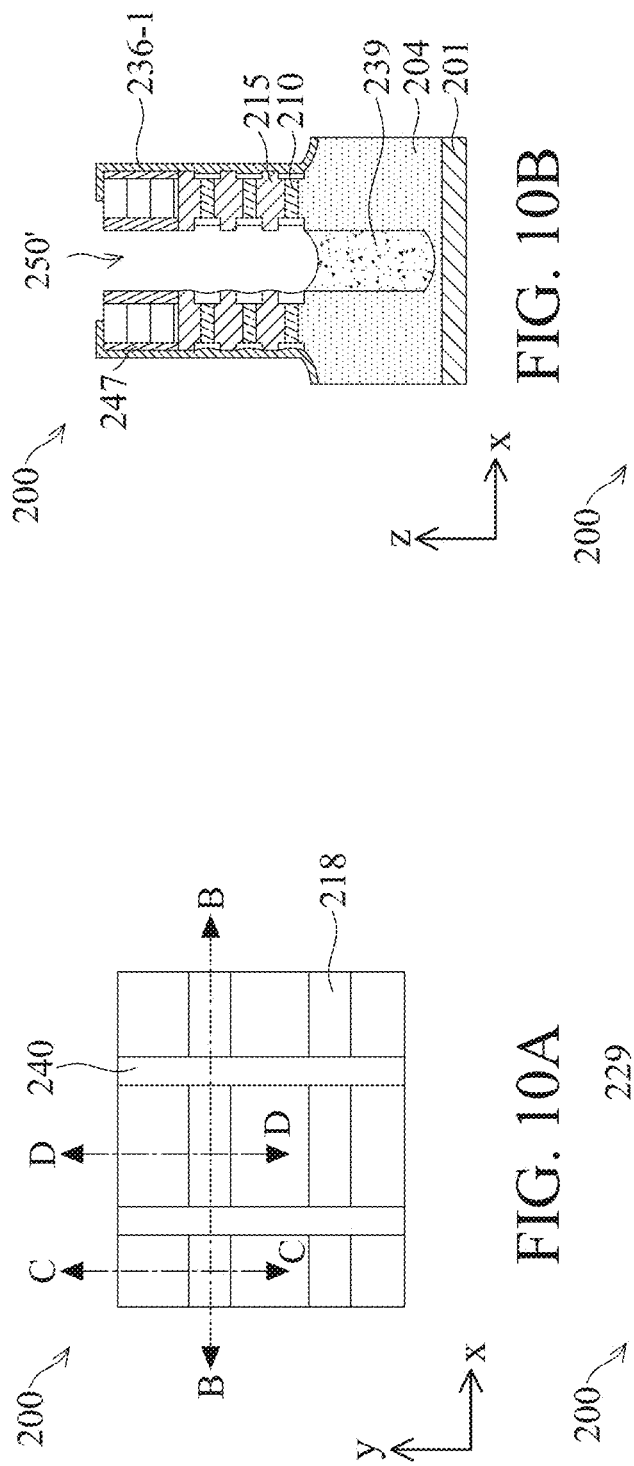

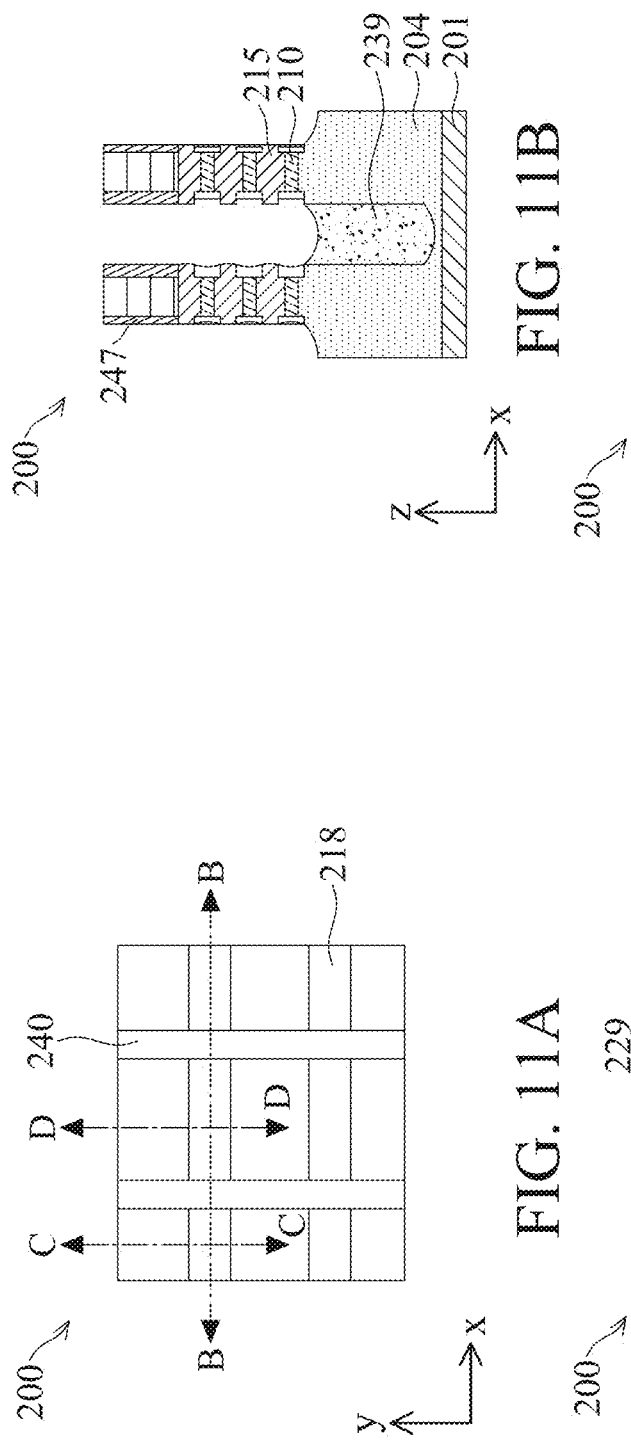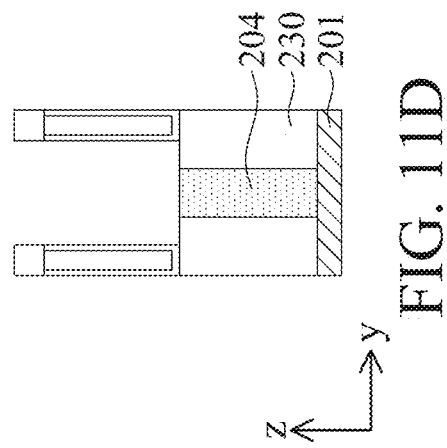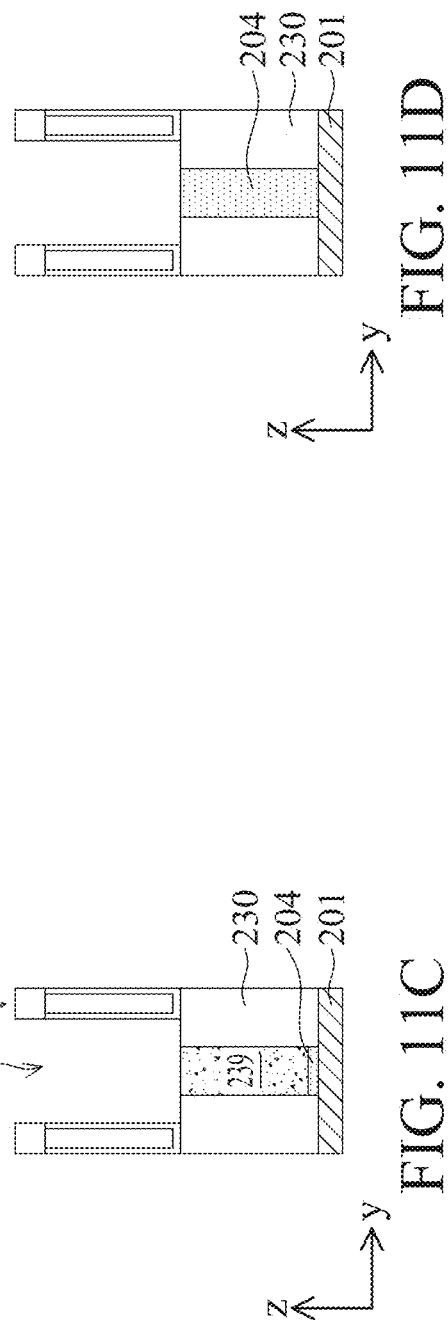

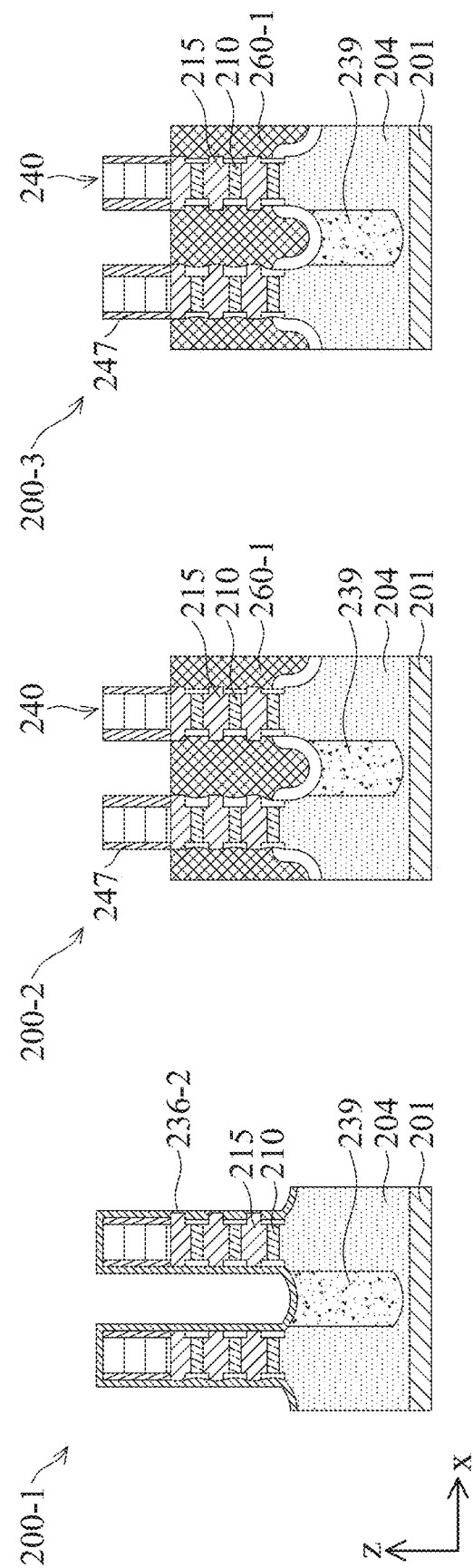

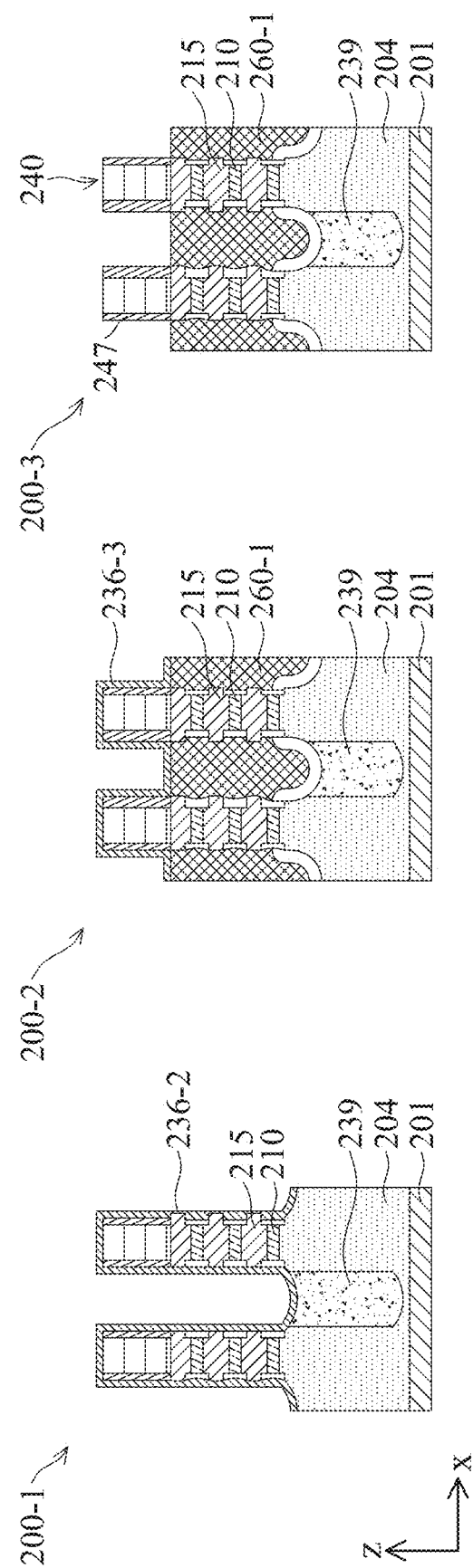

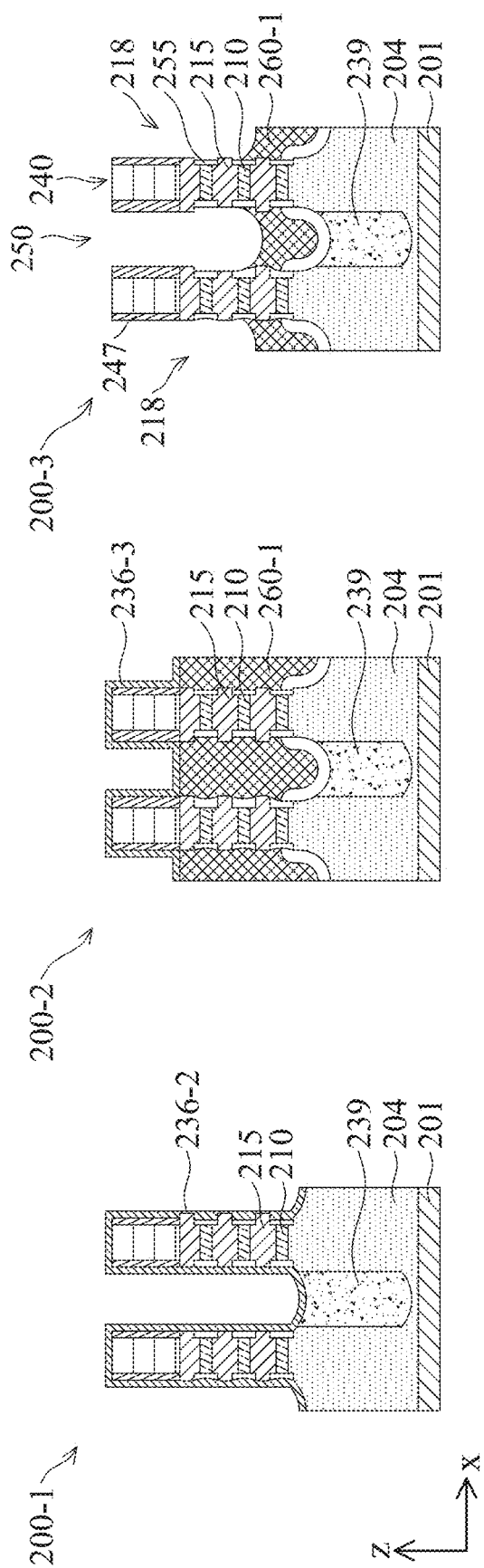

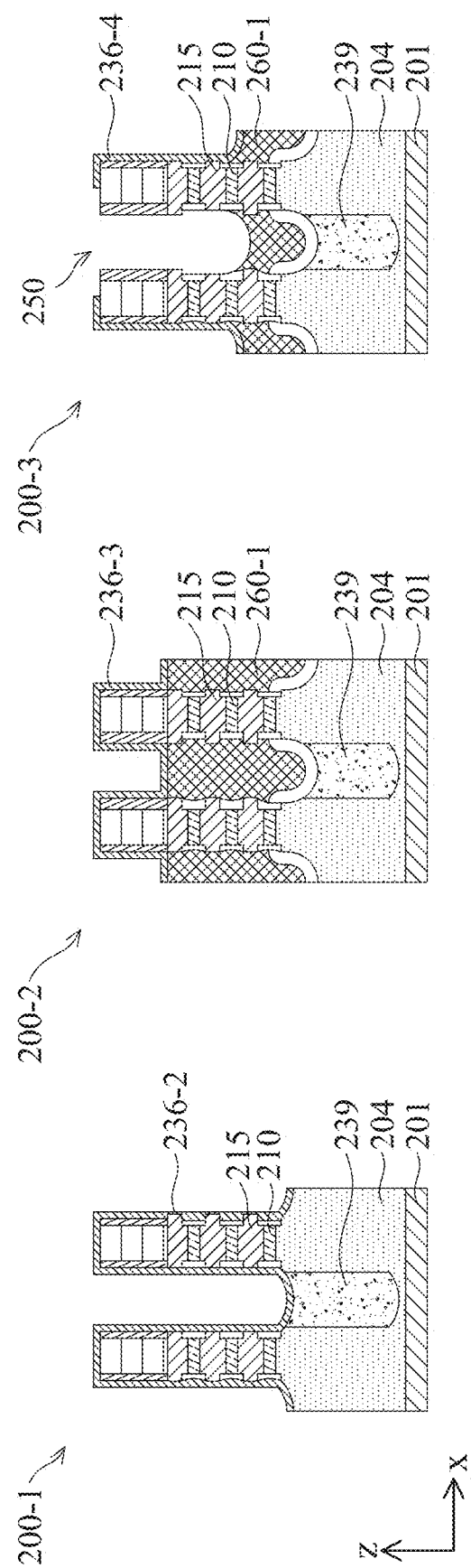

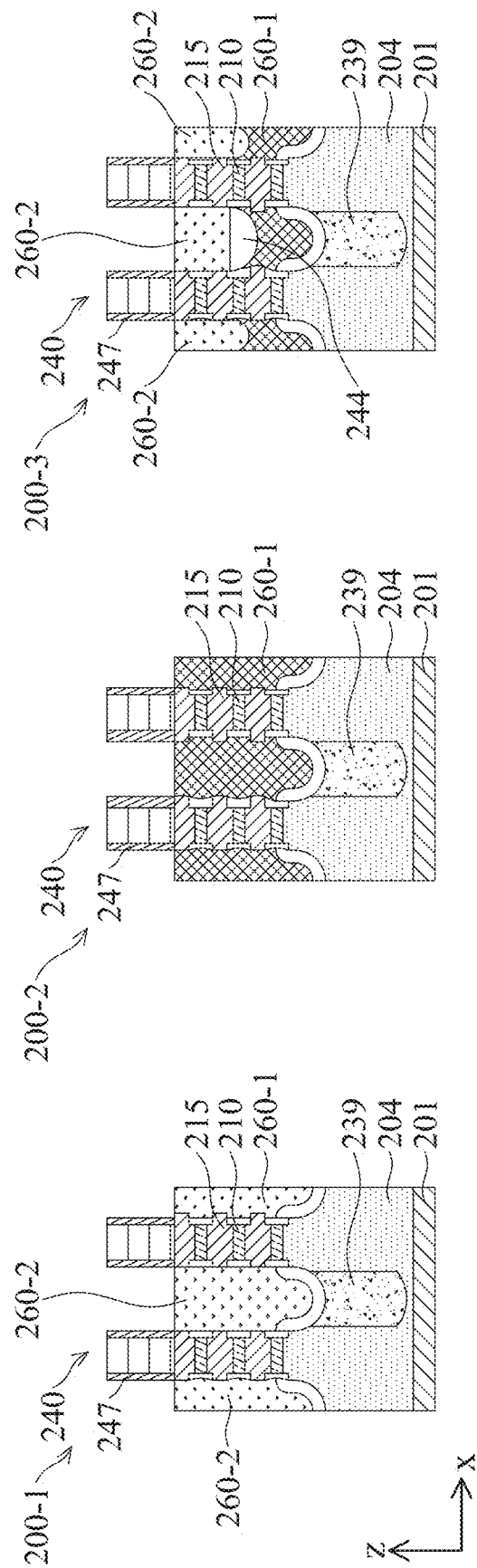

STACKING CMOS STRUCTURE

CROSS-REFERENCE TO RELATED APPLICATIONS

This application is a continuation of U.S. patent application Ser. No. 17/116,552, filed Dec. 9, 2020, issuing as U.S. Pat. No. 11,996,409, which also claims the benefit of U.S. Provisional Application Ser. No. 63/027,811 filed May 20, 2020, the entire disclosures of which are incorporated herein by reference.

BACKGROUND

Conventionally, CMOS devices in integrated circuits (IC) are composed with a pair of an NMOS transistor and a PMOS transistor arranged side-by-side. As device integration continues to increase, scaling down such structure has become more difficult in some instances. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1C, 1E, 1H, and 1J show schematic representations of some example circuits that benefit from various aspects of the present disclosure.

FIGS. 1B, 1D, 1F, 1G, 1I, and 1K illustrate circuits and devices constructed according to various aspects of the present disclosure.

FIGS. 4A, 5A, 6A, 7A, 8A, 9A, 10A, 11A, 12, and 22A illustrate top views of a portion of a semiconductor device, according to some embodiments.

FIGS. 3, 4B, 5B, 5C, 6B, 6C, 6D, 7B, 7C, 7D, 8B, 8C, 8D, 9B, 9C, 9D, 10B, 10C, 10D, 11B, 11C, 11D, 13A-1, 13A-2, 13A-3, 14A-1, 14A-2, 14A-3, 15A-1, 15A-2, 15A-3, 16A-1, 16A-2, 16A-3, 17A-1, 17A-2, 17A-3, 18A-1, 18A-2, 18A-3, 19A-1, 19A-2, 19A-3, 20A-1, 20A-2, 20A-3, 21A-1, 21A-2, 21A-3, 22B, 22C, 23, 24, 25, 26, 27, 28, 29, 30, and 31 illustrate cross-sectional views of a portion of a semiconductor device, according to some embodiments.

DETAILED DESCRIPTION

Figure 1B:
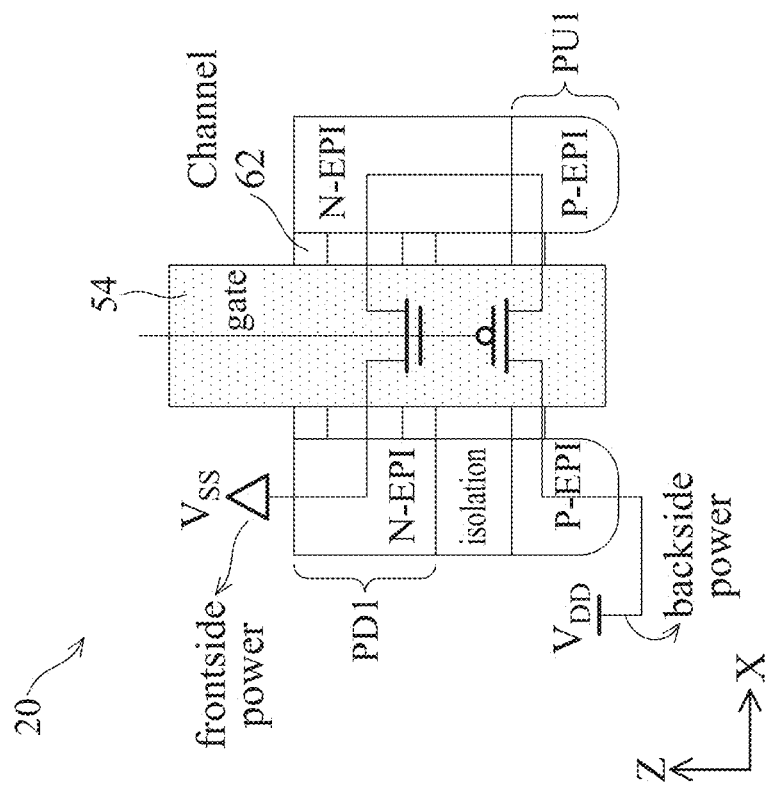

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with stacked CMOS transistors. An object of the present disclosure includes providing vertically-stacked CMOS transistors (or structures), where transistors at the bottom of the stack is powered by backside power rails and transistors at the top of the stack is powered by frontside power rails. Having vertically-stacked CMOS devices aggressively reduces area of CMOS circuits. The vertically-stacked CMOS devices can be used in, for example, SRAM, NAND-flash, NOR-flash, or other circuits. Having both frontside and backside power rails increases the number of metal tracks available in the device for directly connecting to source/drain and gates. It also increases the gate density for greater device integration than existing structures. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. Those of ordinary skill in the art should appreciate that they may readily use the present disclosure as a basis for designing or modifying other processes and structures (such as FinFET devices) for carrying out the same purposes and/or achieving the same advantages of the embodiments introduced herein.

Figure 1A:
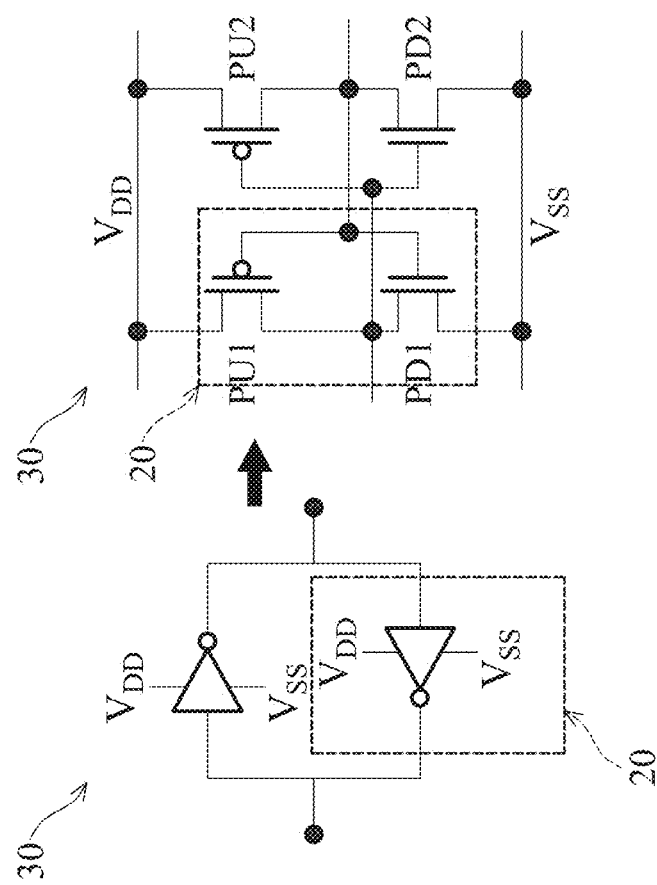

FIG. 1A illustrates a latch circuit 30 having two inverters 20 cross-coupled with each other to form a storage node. Each inverter 20 includes a PMOS transistor (PU1 or PU2) and an NMOS transistor (PD1 or PD2) that share a common gate and a common drain. For example, an inverter 20 includes PU1 and PD1 that share a common gate and share a common drain, the source terminal of PU1 is connected to positive power supply $V_{DD}$, and the source terminal of PD1 is connected to negative power supply $V_{SS}$ (or ground). FIG. 1B illustrates an implementation of the inverter 20 with a stacked CMOS structure according to the present disclosure. Referring to FIG. 1B, the PMOS transistor PU1 includes two p-type epitaxially grown semiconductor layers ("P-EPI") that are connected through a channel 62, and the NMOS transistor PD1 includes two n-type epitaxially grown semiconductor layers ("N-EPI") that are connected through two channels 62. The channels 62 have intrinsic silicon in an embodiment. The N-EPI are disposed vertically over the P-EPI. A gate 54 engages the channels 62 for both the PU1 transistor and the PD1 transistor. The P-EPI and the N-EPI on the left are isolated by an "isolation" material, which will be discussed further later. The P-EPI and the N-EPI on the right are physically and electrically connected, which function as the common drain for the PU1 and the PD1 transistors. The P-EPI on the left is connected to the positive power supply $V_{DD}$ that is implemented on a backside of a wafer. The N-EPI on the left is connected to the negative power supply (or ground) $V_{SS}$ that is implemented on a frontside of the wafer. Effectively, the inverter 20 (which includes the transistors PU1 and PD1 vertically stacked one over another) only occupies the footprint of one transistor, which greatly increases the device integration density. In the depicted embodiment, the PD1 transistor is stacked over the PU1 transistor (i.e., the N-EPI are stacked over the P-EPI), and $V_{SS}$ and $V_{DD}$ are implemented at the frontside and the backside, respectively, of a wafer. In an alternative embodiment, the PU1 transistor is stacked over the PD1 transistor (i.e., the P-EPI are stacked over the N-EPI), and $V_{SS}$ and $V_{DD}$ are implemented at the backside and the frontside, respectively, of a wafer.

Figure 1D:
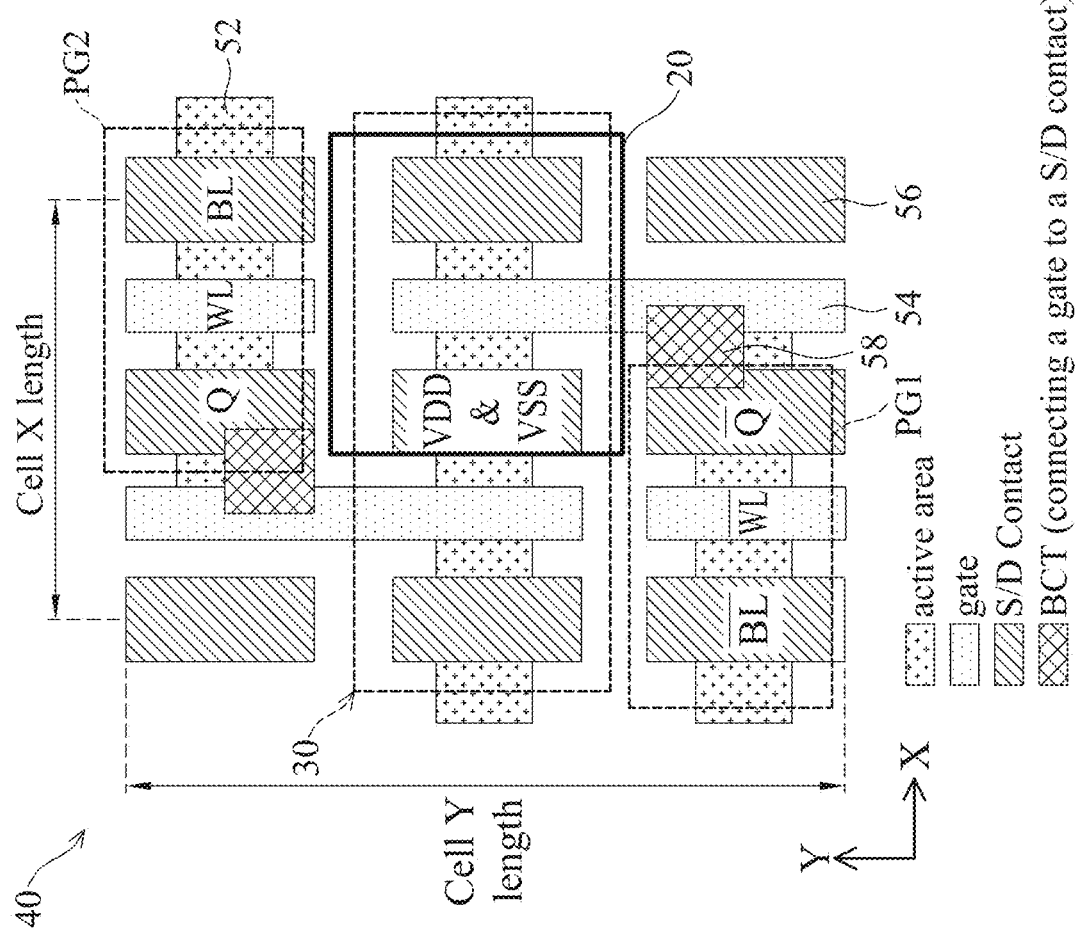
Figure 1C:
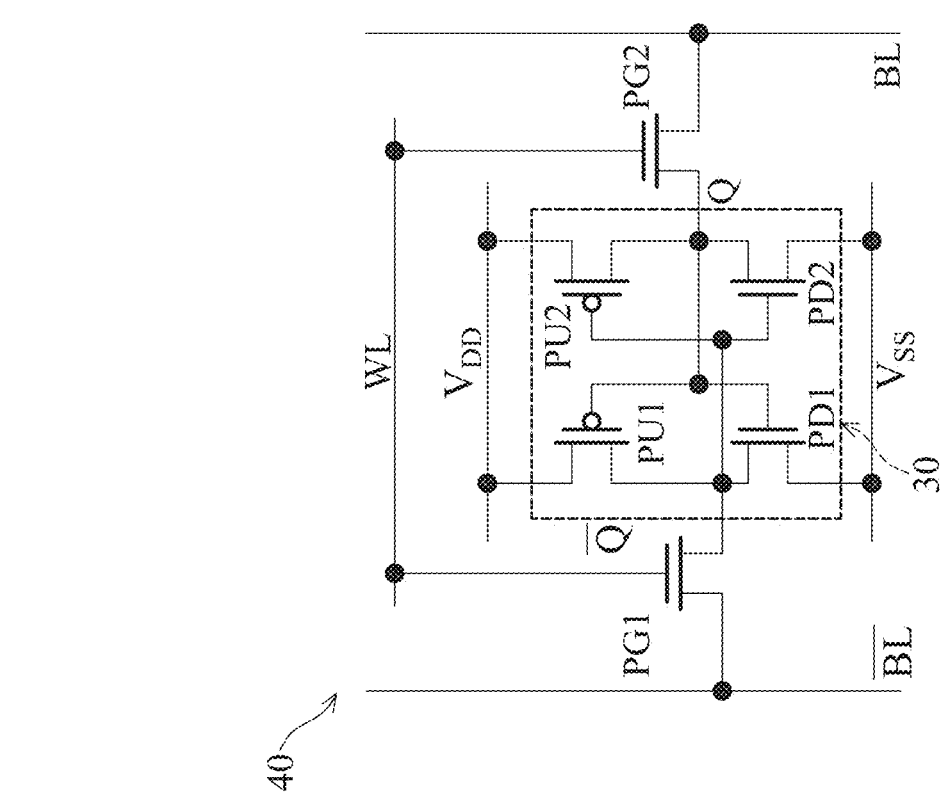

FIG. 1C illustrates a high-density SRAM cell 40 that includes a latch circuit 30 as described with reference to FIG. 1A and further includes two NMOS transistors PG1 and PG2 implemented as pass gate transistors. The gate terminals of PG1 and PG2 are connected to a word line WL, while the source (or drain) terminals of PG1 and PG2 are connected to bit lines BL and/BL (or BLB). FIG. 1D illustrates a layout diagram of certain features of the SRAM cell 40. The layout includes active areas 52 (channels and source/drain (or S/D) of transistors) oriented lengthwise along the "X" direction, gates 54 and S/D contacts 56 oriented lengthwise along the "Y" direction, and bridge connectors 58 that connect some of the gates 54 to some of the S/D contacts 56. The dashed box in FIG. 1D shows the layout of the latch circuit 30, which includes the PU1, PU2, PD1, and PD2 transistors (that form two inverters 20). As discussed with reference to FIG. 1B, the PD1 transistor is stacked over the PU1 transistor and the PD2 transistor is stacked over the PU2 transistor, according to an embodiment of the present disclosure. The length of the SRAM cell 40 along the "Y" direction is only 3 pitches of the active area 52. In approaches where the transistors PD1, PU1, PD2, and PU2 are implemented at the same wafer level (i.e., no stacking), the length of the SRAM cell along the "Y" direction would be 4 pitches of the active area 52. Thus, by stacking the transistors according to the present disclosure (for example, stacking the PD1 over the PU1 and the PD2 over the PU2), the SRAM cell 40 achieves 25% reduction in its footprint. In other words, the integration density of the SRAM cell 40 gains 25% over the other approaches.

FIG. 1E illustrates a high-current SRAM cell 50 that is similar to the SRAM cell 40 described with reference to FIG. 1C. However, the NMOS transistors PD1' and PD2' of the SRAM cell 50 can conduct higher current than the PD1 and PD2 transistors of the SRAM cell 40. In some embodiments, each of the PD1' and PD2' transistors of the SRAM cell 50 is implemented as multiple NMOS transistors connected in parallel. The latch circuit of the SRAM cell 50 is labeled as 30'. FIG. 1F illustrates a layout diagram of certain features of the SRAM cell 50. The dashed box in FIG. 1F shows the layout of the latch circuit 30', which includes the PU1, PU2, PD1', and PD2' transistors. The box 20' corresponds to the layout of one of the inverters, for example, the inverter comprising the PU1 and PD1'. FIG. 1G illustrates a perspective view of the inverter 20' as implemented on a wafer. As shown in FIG. 1G, the inverter 20' is implemented with three transistors, a first NMOS field effect transistor (or N-FET) in the back, a second N-FET in the front, and a PMOS transistor (or P-FET) in the front. The second N-FET is stacked over the P-FET, as discussed with reference to FIG. 1B. The two N-FETs are connected in parallel by S/D contacts 56 and share a common gate 54. The N-FETs have N-EPI S/D features connected by channels 62, and the P-FET has P-EPI S/D features connected by a channel 62. By utilizing the stacked CMOS structure of the present embodiment, the layout of the SRAM cell 50 (FIG. 1F) only occupies 4 pitches of the active areas 52, achieving 20% reduction in its footprint, compared with approaches where all transistors are implemented at the same wafer level (no stacking). In other words, the integration density of the SRAM cell 50 gains 20% over the other approaches.

Figure 1I:
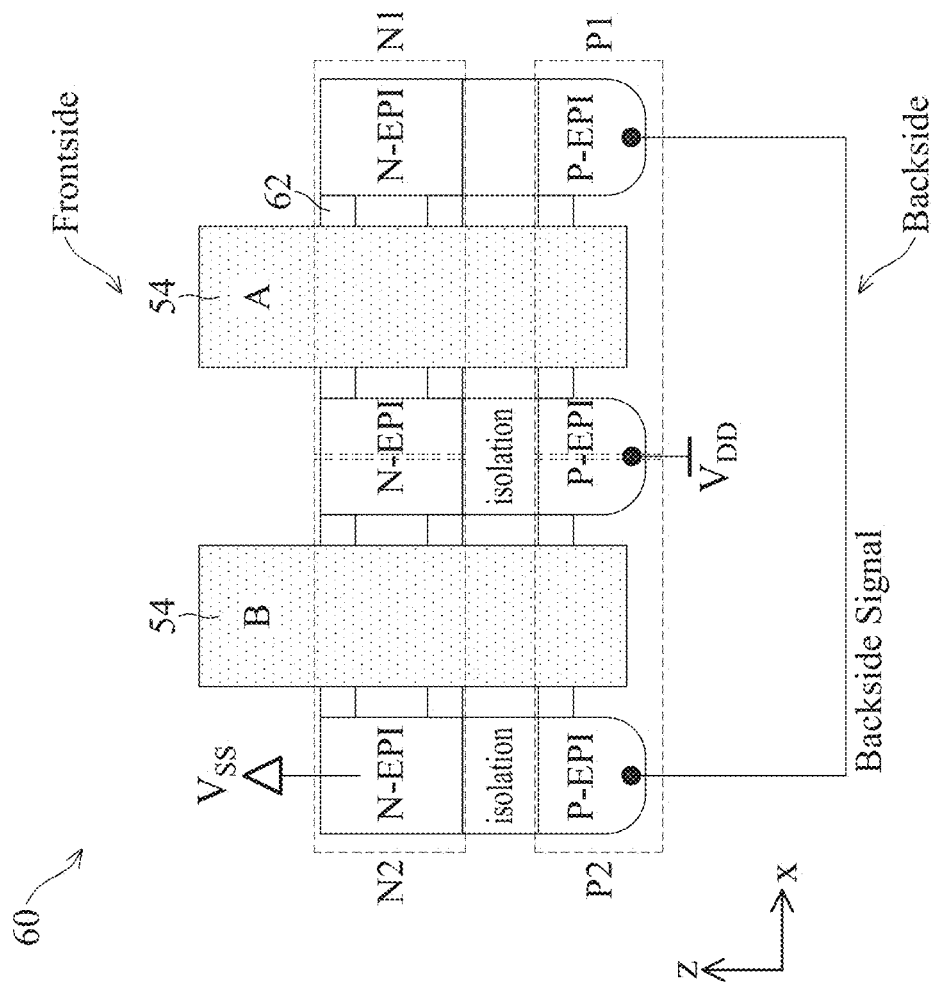
Figure 1H:
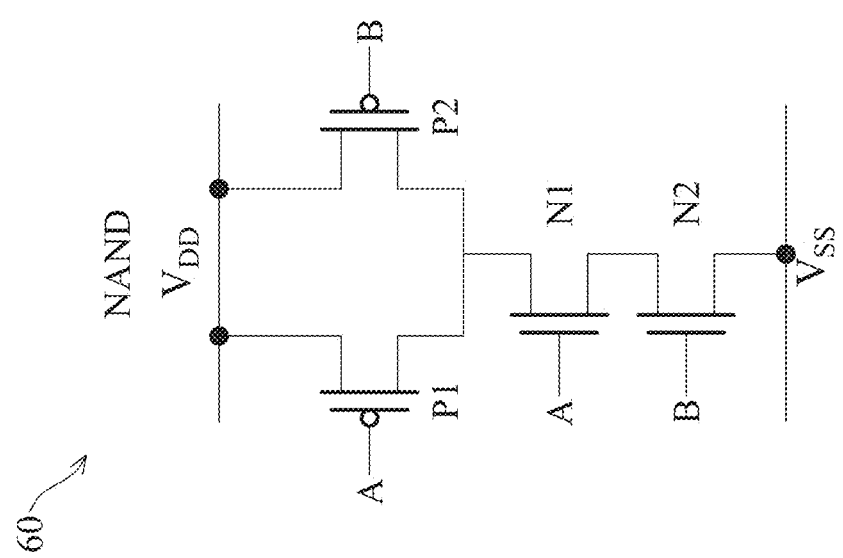

FIG. 1H illustrates a schematic representation of a NAND circuit 60. The NAND circuit 60 includes two P-FETs P1 and P2 connected in parallel and two N-FETs N1 and N2 connected in series. The drain terminals of the N1, P1, and P2 transistors are connected to each other. The source terminals of the P1 and P2 transistors are connected to $V_{DD}$. The source terminal of the N2 transistor is connected to $V_{SS}$. FIG. 1I illustrates an implementation of the NAND 60 with stacked CMOS structures according to the present disclosure. Referring to FIG. 1I, each of the P1 and P2 transistors includes two P-EPI that are connected through a channel 62. The P-EPI drain features of P1 and P2 are connected through a backside signal line (i.e., a metal line implemented on the backside of a wafer). The transistors P1 and P2 share a common P-EPI source feature which is connected to $V_{DD}$ implemented on the backside of the wafer. Each of the N1 and N2 transistors includes two N-EPI that are connected through two channels 62. The N-EPI drain feature of the N1 transistor is directly connected to the P-EPI drain feature of the P1 transistor. The other N-EPI features are isolated from the P-EPI features by an isolation material. The N-EPI source feature of the N2 transistor is connected to $V_{SS}$ implemented at the frontside of the wafer. The gates 54 engage the channels 62. By stacking the N1 and N2 transistors on top of the P1 and P2 transistors, the NAND 60 of the present disclosure advantageously reduces its footprint on the wafer. In the embodiment depicted in FIG. 1I, the NMOS transistors N1 and N2 are disposed over the PMOS transistors P1 and P2. In an alternative embodiment, the NAND circuit 60 can be implemented by stacking the PMOS transistors P1 and P2 over the NMOS transistors N1 and N2, implementing the $V_{SS}$ on the backside of a wafer, and implementing the $V_{DD}$ on the frontside of the wafer.

Figure 1K:
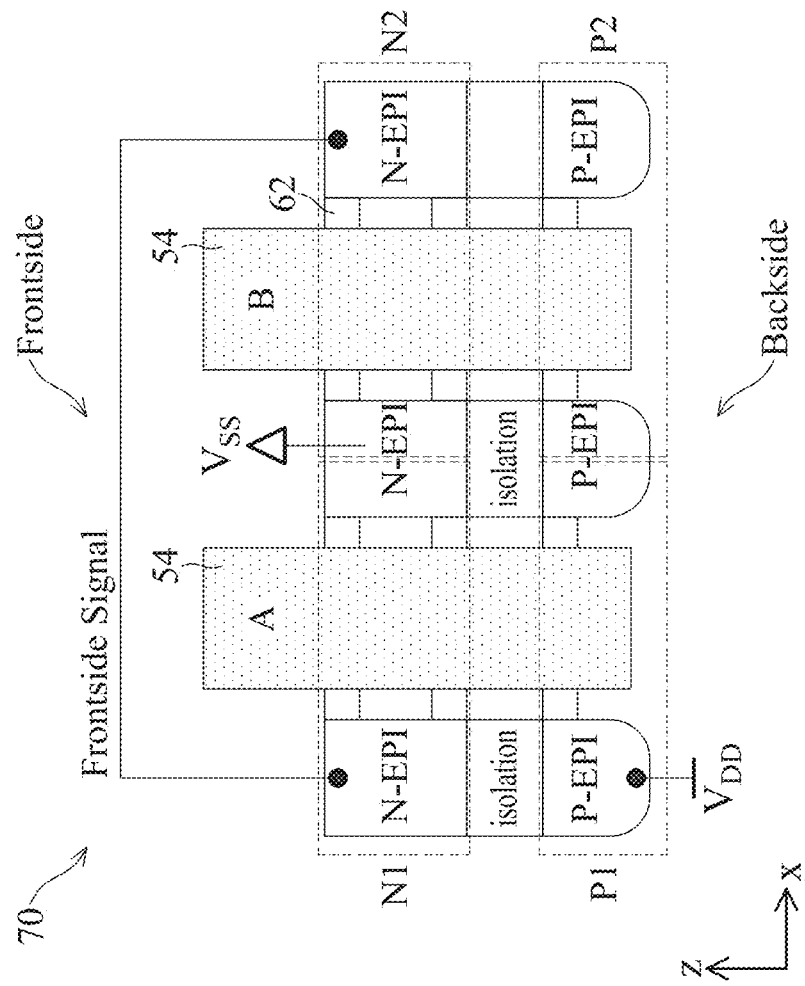
Figure 1J:
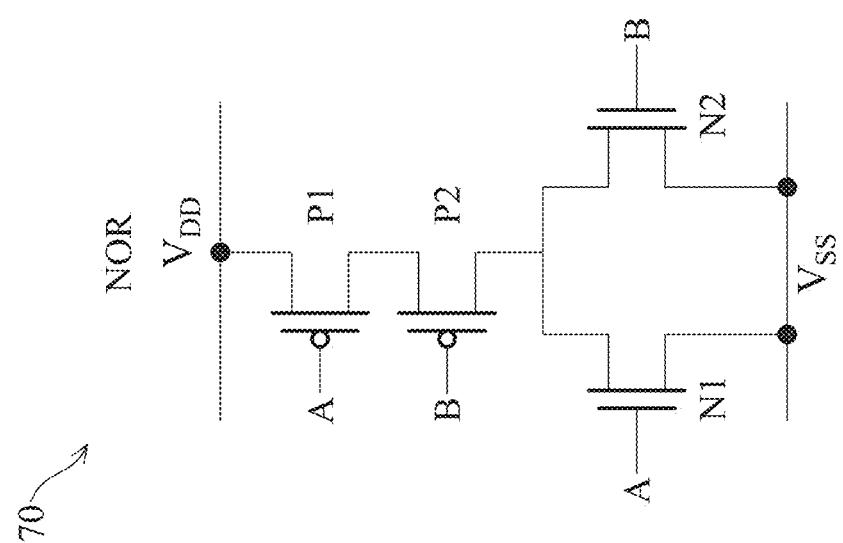

FIG. 1J illustrates a schematic representation of a NOR circuit 70. The NOR circuit 70 includes two P-FETs P1 and P2 connected in series and two N-FETs N1 and N2 connected in parallel. The drain terminals of the P2, N1, and N2 transistors are connected to each other. The source terminals of the P1 transistor is connected to $V_{DD}$. The source terminals of the N1 and the N2 transistors are connected to $V_{SS}$. FIG. 1K illustrates an implementation of the NOR 70 with stacked CMOS structures according to the present disclosure. Referring to FIG. 1K, each of the P1 and P2 transistors includes two P-EPI that are connected through a channel 62. The P-EPI source feature of P1 is connected to $V_{DD}$ implemented on the backside of the wafer. The P1 and P2 transistors share a common P-EPI source/drain feature. Each of the N1 and N2 transistors includes two N-EPI that are connected through two channels 62. The N-EPI drain feature of the N2 transistor is directly connected to the P-EPI drain feature of the P2 transistor. The other N-EPI features are isolated from the P-EPI features by an isolation material. The N-EPI drain features of N1 and N2 transistors are connected together through a signal line implemented at the frontside of the wafer. The N-EPI source features of the N1 and N2 transistors are shared and are connected to $V_{SS}$ implemented at the frontside of the wafer. The gates 54 engage the channels 62. By stacking the N1 and N2 transistors on top of the P1 and P2 transistors, the NOR 70 of the present disclosure advantageously reduces its footprint on the wafer. In the embodiment depicted in FIG. 1K, the NMOS transistors N1 and N2 are disposed over the PMOS transistors P1 and P2. In an alternative embodiment, the NOR circuit 70 can be implemented by stacking the PMOS transistors P1 and P2 over the NMOS transistors N1 and N2, implementing the $V_{SS}$ on the backside of a wafer, and implementing the $V_{DD}$ on the frontside of the wafer.

FIGS. 1A, IC, 1E, 1H, and 1J are non-limiting example circuits that can benefit from the stacking CMOS structure of the present disclosure. Notably, the disclosed inverters, latches, SRAM cells, NAND, and NOR circuits are among the building blocks of CMOS integrated circuit. Those of ordinary skill in the art should appreciate that they may readily use the present disclosure as a basis for designing or modifying other circuits for carrying out the same purposes and/or achieving the same advantages of the embodiments introduced herein without departing from the spirit and scope of the present disclosure.

FIGS. 2A, 2B, 2C, and 2D are a flow chart of a method 100 for fabricating a semiconductor device with stacked CMOS structure according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 3 through FIG. 31 that illustrate various top and cross-sectional views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LD-MOS) transistors, high voltage transistors, high frequency transistors, memory devices, other suitable components, or combinations thereof. FIGS. 3 through 31 have been simplified for the sake of clarity to better understand the inventive concepts of the present disclosure. Additional features can be added in the device 200, and some of the features described below can be replaced, modified, or eliminated in other embodiments of the device 200.

At operation 102, the method 100 (FIG. 2A) provides a structure that includes a substrate 201 with various components built in or on the substrate 201, including semiconductor fins 218, an isolation structure 230, dielectric (isolation) fins 229, sacrificial (or dummy) gate stacks 240, gate spacers 247, and various other components, such as shown in FIGS. 3 through 5C. These components and the methods of making them are further discussed below by referring to FIGS. 3 through 5C.

Figure 3:
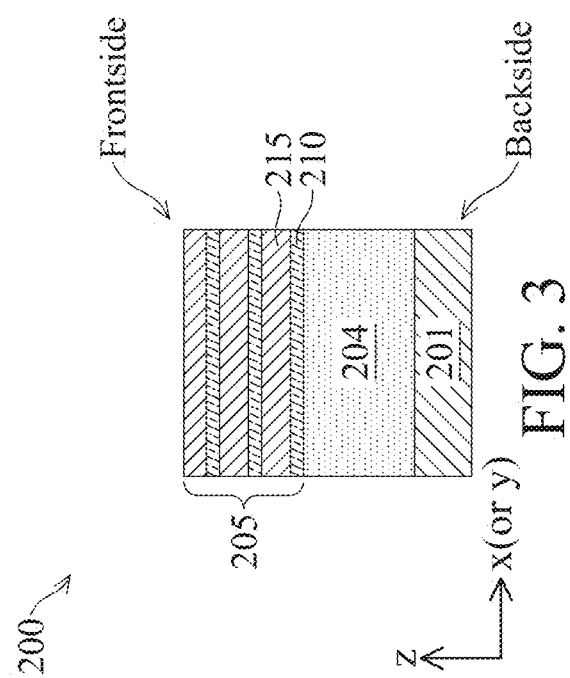

Referring to FIG. 3, a stack 205 of semiconductor layers 210 and 215 are formed over a semiconductor layer 204 over a substrate 201. In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. In embodiments, the semiconductor layer 204 can be silicon, silicon germanium, germanium, or other suitable semiconductor.

The semiconductor layer stack 205 includes semiconductor layers 210 and semiconductor layers 215 stacked vertically (e.g., along the z-direction) in an interleaving or alternating configuration. In some embodiments, semiconductor layers 210 and semiconductor layers 215 are epitaxially grown in the depicted interleaving and alternating configuration. Epitaxial growth of semiconductor layers 210 and semiconductor layers 215 may be achieved by a molecular beam epitaxy (MBE) process, a chemical vapor deposition (CVD) process, a metalorganic chemical vapor deposition (MOCVD) process, other suitable epitaxial growth process, or combinations thereof. A composition of semiconductor layers 210 is different than a composition of semiconductor layers 215 to achieve etching selectivity and/or different oxidation rates during subsequent processing. For example, semiconductor layers 210 and semiconductor layers 215 may include different materials, constituent atomic percentages, constituent weight percentages, thicknesses, and/or characteristics to achieve desired etching selectivity and/or different oxidation rates. For example, semiconductor layers 210 include silicon germanium and semiconductor layers 215 include silicon, in an embodiment. In some embodiments, semiconductor layers 210 and semiconductor layers 215 can include the same material but with different constituent atomic percentages to achieve the etching selectivity and/or different oxidation rates. For example, both semiconductor layers 210 and 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200. For example, semiconductor layer stack 205 can include two to ten semiconductor layers 210 and two to ten semiconductor layers 215. As will be discussed, the method 100 will process layers at both sides of the substrate 201. In the present disclosure, the side of the substrate 201 where the stack 205 resides is referred to as the frontside and the side opposite the frontside is referred to as the backside.

Figure 4B:
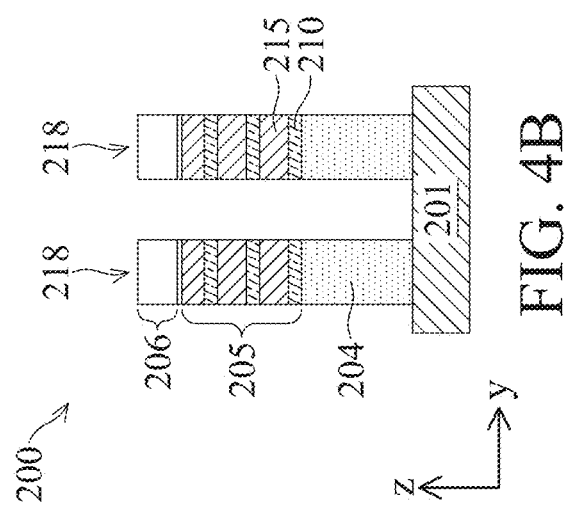
Figure 4A:
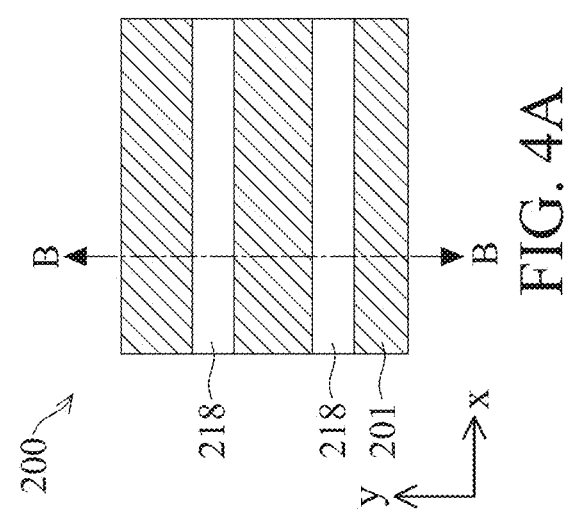

FIG. 4A illustrates a top view of the device 200 with fins 218 oriented along the "x" direction, and FIG. 4B illustrates a cross-sectional view of the device 200, in portion, along the B-B line in FIG. 4A. As illustrated in FIG. 4B, the fins 218 include the patterned stack 205 (having layers 210 and 215), patterned regions 204, and one or more patterned hard mask layers 206. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element may be used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

Figure 5A:
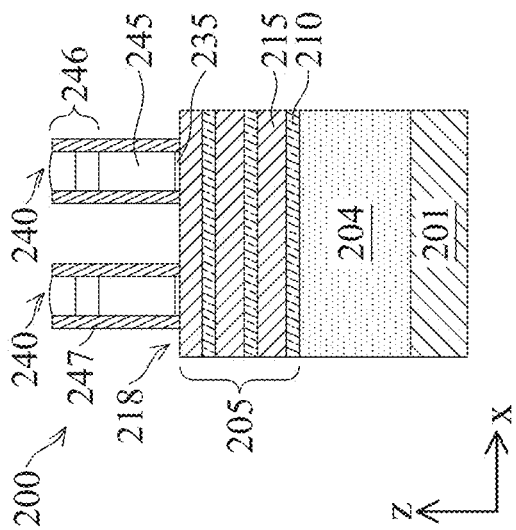
Figure 5B:
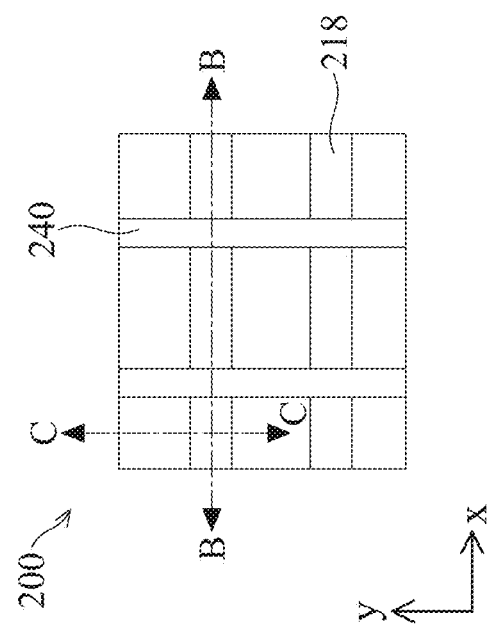
Figure 5C:
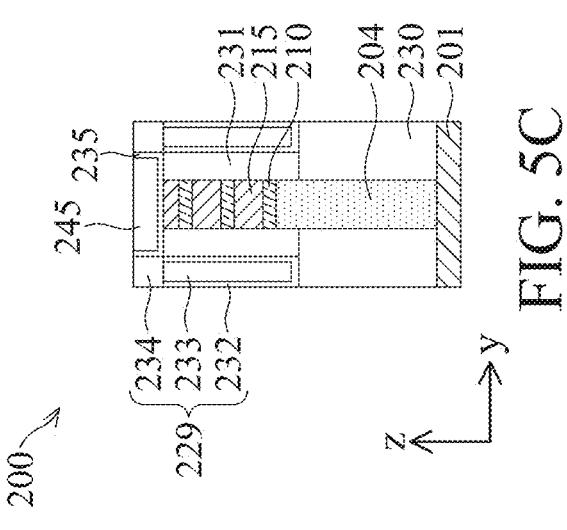

FIG. 5A illustrates a top view of the device 200, and FIGS. 5B and 5C illustrate cross-sectional views of the device 200, in portion, along the B-B line and the C-C line of FIG. 5A, respectively. Referring to FIGS. 5A, 5B, and 5C, various components are built around and/or above the fins 218, including an isolation structure (or feature) 230 isolating the bottom portion of the fins 218, a cladding layer 231 over the isolation structure 230 and on sidewalls of the fins 218, dielectric (or dummy) fins 229 over the isolation structure 230 and on sidewalls of the cladding layer 231, sacrificial gate stacks 240 over the fins 218, and gate spacers 247 on sidewalls of the sacrificial gate stacks 240.

Referring to FIG. 5C, the isolation feature(s) 230 is formed over substrate 201 to isolate various regions of the device 200. For example, isolation features 230 surround a bottom portion of fins 218 to separate and isolate fins 218 from each other. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 218 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer.

The cladding layer 231 is deposited over the sidewall surfaces of the fins 218 and above the isolation features 230. In an embodiment, the cladding layer 231 includes SiGe. The cladding layer 231 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof.

In the present embodiment, the dielectric fin 229 includes a dielectric liner 232, a dielectric fill layer 233, and a dielectric helmet 234. The dielectric fin 229 may be configured differently in alternative embodiments. The dielectric liner 232 is deposited over the sidewalls of the cladding layer 231 and on top surfaces of the isolation features 230, and the dielectric fill layer 233 is deposited over the dielectric liner 232 and fills gaps between the fins 218. In an embodiment, the dielectric liner 232 includes a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, k is less than about 7. The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, tetraethylorthosilicate (TEOS) formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods.

The dielectric helmet 234 is deposited over the dielectric layers 232 and 233 and between the cladding layer 231 on opposing sidewalls of the fins 218. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, k>7. The dielectric helmet 234 is formed by any of the processes described herein, such as ALD, CVD, PVD, oxidation-based deposition process, other suitable process, or combinations thereof. In an embodiment, the dielectric layers 232 and 233 may be recessed using a selective etching process that etches the dielectric layers 232 and 233 with no (or minimal) etching to the hard mask 206 (FIG. 4B) and the cladding layer 231. Then, one or more dielectric materials are deposited into the recesses and a CMP process is performed to the one or more dielectric materials to form the dielectric helmet 234. Subsequently, the hard mask layers 206 is removed, and the sacrificial gate stacks 240 are formed over the fins 218.

Referring to FIG. 5B, the sacrificial gate stacks 240 include a dummy gate dielectric layer 235, a dummy gate electrode layer 245, and one or more hard mask layers 246. In the present embodiment, the sacrificial gate stacks 240 will be replaced with functional gate stacks 240' in a later fabrication step. In some embodiments, the dummy gate dielectric 235 includes a dielectric material, such as silicon oxide, a high-k dielectric material, other suitable dielectric material, or combinations thereof; the dummy gate electrode layer 245 includes polysilicon or other suitable material; and the one or more hard mask layers 246 include silicon oxide, silicon nitride, or other suitable materials. Sacrificial gate stacks 240 are formed by deposition processes, lithography processes, etching processes, other suitable processes, or combinations thereof. For example, the layers 235, 245, and 246 may be deposited using CVD, PVD, ALD, or other suitable methods. Then, a lithography patterning and etching process is performed to pattern the layers 235, 245, and 246 to form sacrificial gate stacks 240, as depicted in FIG. 5B. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Still referring to FIG. 5B, the gate spacers 247 are disposed on sidewalls of the sacrificial gate stacks 240. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over sacrificial gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to sacrificial gate stacks 240.

Figure 6A:
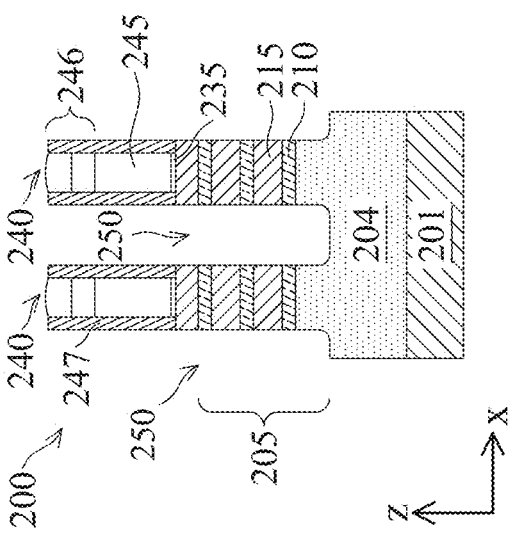
Figure 6B:
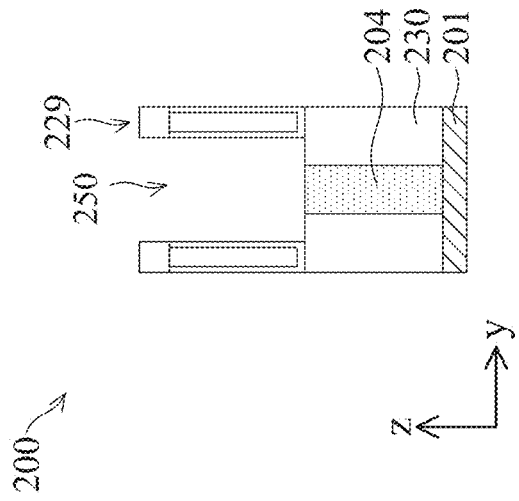
Figure 6C:
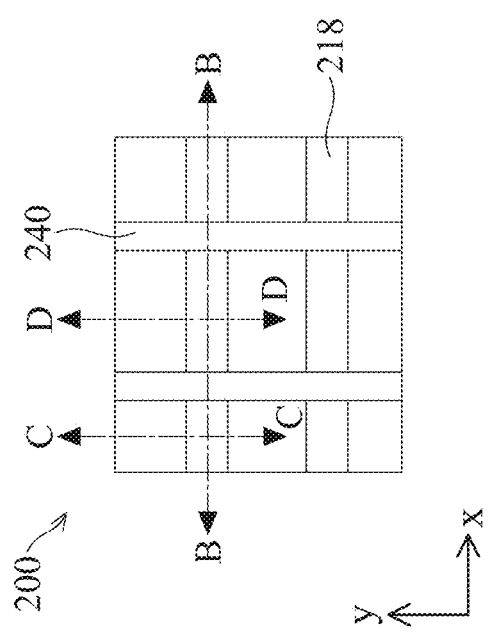
Figure 6D:
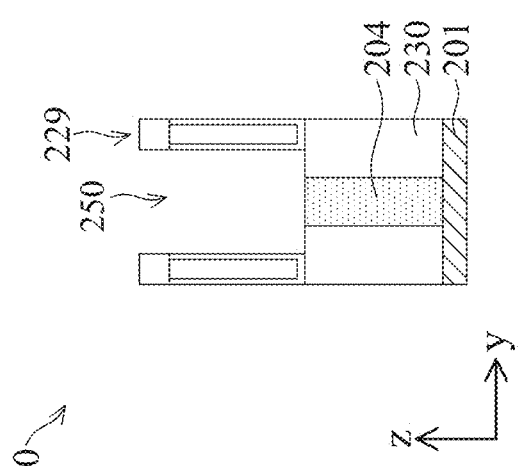

At operation 104, the method 100 (FIG. 2A) forms source/drain (S/D) trenches 250 by etching the fins 218 adjacent the gate spacers 247. The resultant structure is shown in FIGS. 6A-6D according to an embodiment. FIG. 6A illustrates a top view of the device 200, and FIGS. 6B, 6C, and 6D illustrate cross-sectional views of the device 200, in portion, along the B-B line, the C-C line, and the D-D line in FIG. 6A, respectively. Particularly, the C-C line is cut into one of the source/drain regions of the transistors and is parallel to the gate stacks 240, and the D-D line is cut into the other source/drain regions of the transistors and is parallel to the gate stacks 240. The C-C lines and the D-D lines in FIGS. 7A through 11A are similarly configured.

In the depicted embodiment, an etching process completely removes semiconductor layer stack 205 in source/drain regions of fins 218 thereby exposing the semiconductor layer 204 of fins 218 in the source/drain regions. Source/drain trenches 250 thus have sidewalls defined by remaining portions of semiconductor layer stack 205, which are disposed in channel regions under the gate stacks 240, and bottoms defined by the semiconductor layer 204 and the isolation structure 230. In some embodiments, the etching process removes some, but not all, of semiconductor layer stack 205, such that source/drain trenches 250 have bottoms defined by semiconductor layer 210 or semiconductor layer 215 in source/drain regions. In some embodiments, the etching process further removes some, but not all, of the semiconductor layer 204 of fins 218, such that source/drain trenches 250 extend below a topmost surface of the isolation structure 230. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate stacks 240 and/or isolation features 230. In some embodiments, a lithography process, such as those described herein, is performed to form a patterned mask layer that covers gate stacks 240 and/or isolation features 230, and the etching process uses the patterned mask layer as an etch mask.

At operation 106, the method 100 (FIG. 2A) forms inner spacers 255. The resultant structure is shown in FIGS. 7A-7D. FIG. 7A illustrates a top view of the device 200, and FIGS. 7B, 7C, and 7D illustrate cross-sectional views of the device 200, in portion, along the B-B line, the C-C line, and the D-D line in FIG. 7A, respectively. In an embodiment, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and 204 under gate spacers 247. Portions (edges) of semiconductor layers 215 are thus suspended in the channel regions under gate spacers 247. The first etching process is a dry etching process, a wet etching process, other suitable etching process, or combinations thereof. A deposition process then forms a spacer layer that partially (and, in some embodiments, completely) fills the source/drain trenches 250. The deposition process is configured to ensure that the spacer layer fills the gaps between semiconductor layers 215 and between semiconductor layers 215 and 204 under gate spacers 247. A second etching process is then performed that selectively etches the spacer layer to form inner spacers 255 as depicted in FIG. 7B with minimal (to no) etching of semiconductor layers 215, dummy gate stacks 240, and gate spacers 247. The inner spacers 255 include a material that is different than a material of semiconductor layers 215 and a material of gate spacers 247 to achieve desired etching selectivity during the second etching process. The spacer layer 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein.

Figure 8B:
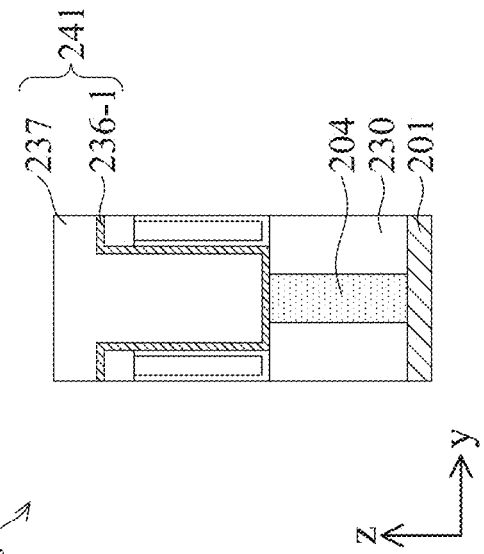
Figure 8D:
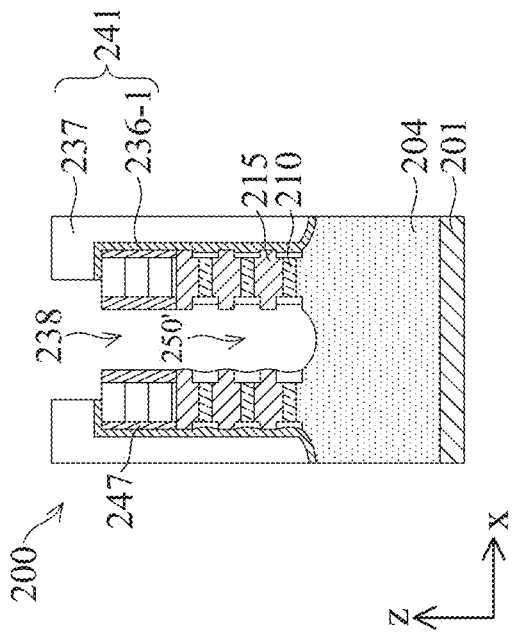
Figure 8A:
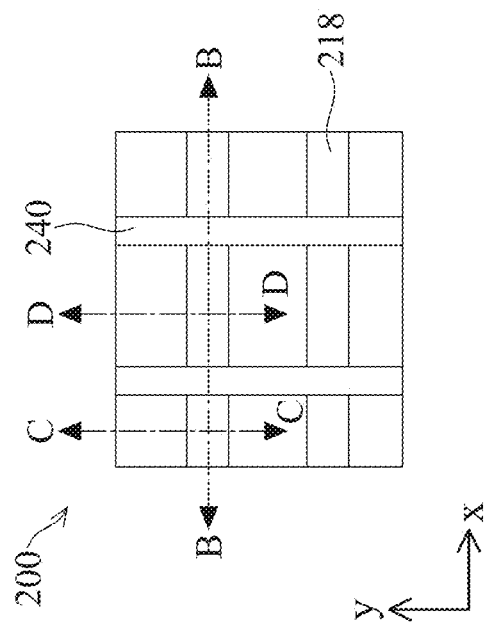
Figure 8C:

At operation 108, the method 100 (FIG. 2A) forms an etch mask 241 that covers some of the S/D trenches 250 and leaves others of the S/D trenches 250 exposed through openings 238 in the etch mask 241. FIG. 8A illustrates a top view of the device 200, and FIGS. 8B, 8C, and 8D illustrate cross-sectional views of the device 200, in portion, along the B-B line, the C-C line, and the D-D line in FIG. 8A, respectively. In the present embodiment, the S/D trenches 250 exposed through the opens 238 are those where S/D features formed therein will be connected to backside power rails or backside signal lines. These S/D features may be source features only, drain features only, or a mix of source features and drain features in various embodiments. For the convenience of discussion, the S/D trenches 250 that are exposed through the etch mask 241 are referred to as S/D trenches 250'. The etch mask 241 includes a patterned hard mask 236-1 and a patterned resist 237 in the present embodiment. The etch mask 241 may additionally include a bottom anti-reflective coating (BARC) layer between the patterned hard mask 236-1 and the patterned resist 237 in some embodiments. The patterned resist 237 may be formed using resist coating (for example, spin-on coating), soft baking, mask aligning, exposure, post-exposure baking, resist developing, rinsing, drying (for example, hard baking), other suitable lithography processes, or combinations thereof. The patterned hard mask 236-1 is formed by depositing a hard mask layer (before the resist 237 is spin coated) and etching the hard mask layer using the patterned resist 237 as an etch mask.

Figure 9B:
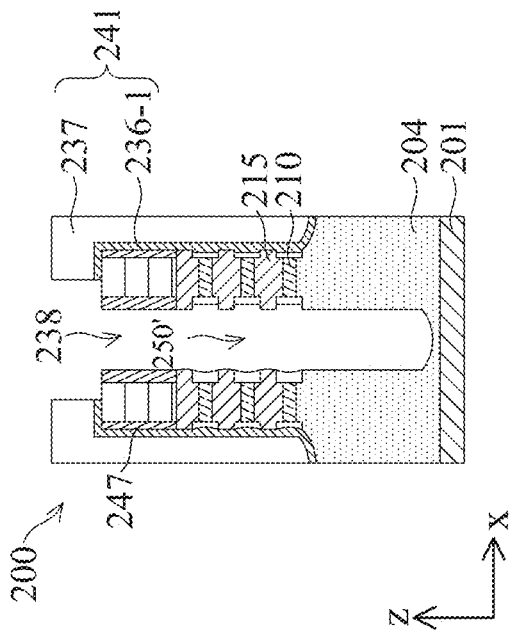
Figure 9D:
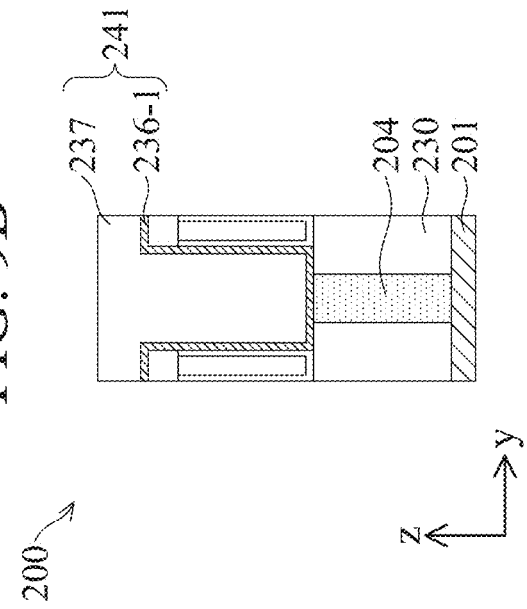
Figure 9A:
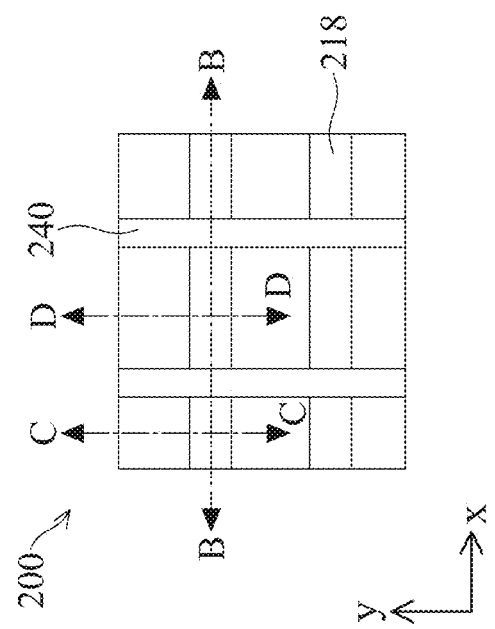
Figure 9C:
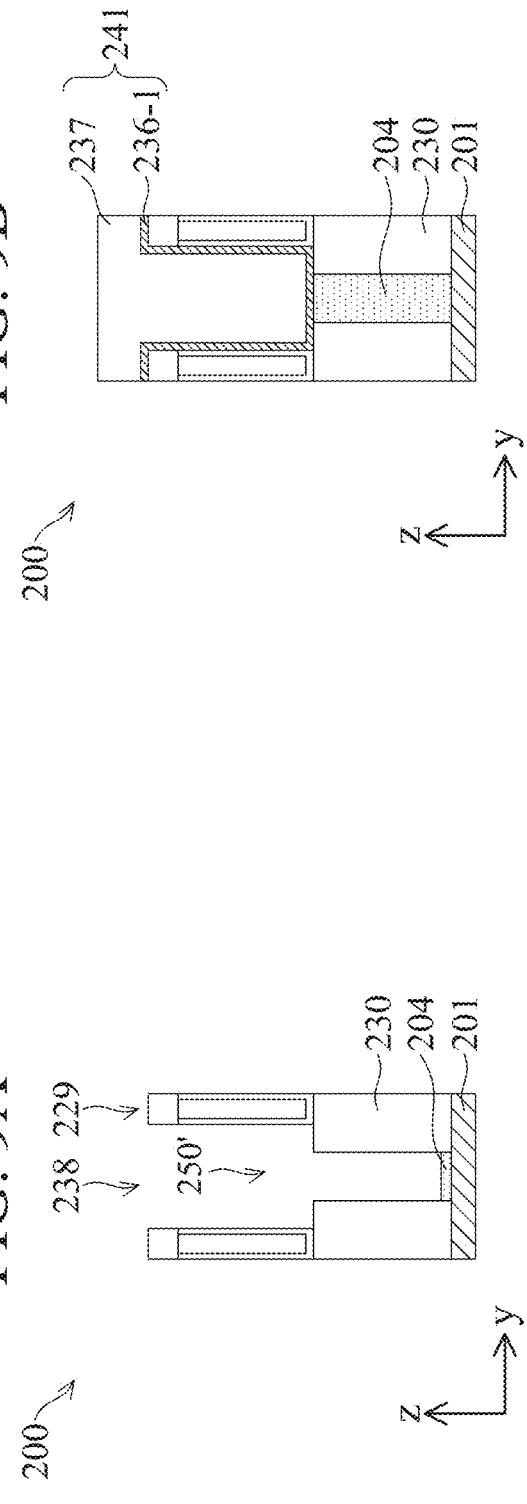

At operation 110, the method 100 (FIG. 2A) etches the S/D trenches 250' to extend them deeper. The resultant structure is shown in FIGS. 9A-9D. FIG. 9A illustrates a top view of the device 200, and FIGS. 9B, 9C, and 9D illustrate cross-sectional views of the device 200, in portion, along the B-B line, the C-C line, and the D-D line in FIG. 9A, respectively. The etching process may include dry etching, wet etching, reactive ion etching, or other suitable etching. The etching process is substantially anisotropic (i.e., substantially vertical) in this embodiment. Also, the etching process is tuned selective to the material of the semiconductor layer 204 and with no (or minimal) etching to the etch mask 241, the gate spacers 247, the dummy dielectric fins 229, the gate hard mask layers 246, the inner spacers 255, and the isolation structure 230. The source/drain trenches 250' are etched until only a thin layer 204 remains therein, thereby extending the source/drain trenches 250' into the substrate 201. After the etching process finishes, the operation 110 removes the patterned resist 237, for example, by a stripping process.

At operation 112, the method 100 (FIG. 2A) forms a semiconductor layer 239 in the source/drain trenches 250'. The resultant structure is shown in FIGS. 10A-10D according to an embodiment. FIG. 10A illustrates a top view of the device 200, and FIGS. 10B, 10C, and 10D illustrate cross-sectional views of the device 200, in portion, along the B-B line, the C-C line, and the D-D line in FIG. 10A, respectively. The semiconductor layer 239 may be deposited using an epitaxial growth process or by other suitable processes. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in the semiconductor layer 204 to achieve etching selectivity during subsequent processing. For example, semiconductor layers 239 and 204 may include different materials, different constituent atomic percentages, different constituent weight percentages, and/or other characteristics to achieve desired etching selectivity during an etching process. In an embodiment, the semiconductor layer 204 includes silicon and the semiconductor layer 239 includes silicon germanium. In another embodiment, semiconductor layers 239 and 204 can both include silicon germanium, but with different silicon atomic percent. The present disclosure contemplates that semiconductor layers 239 and 204 include any combination of semiconductor materials that can provide desired etching selectivity, including any of the semiconductor materials disclosed herein. Since other source/drain trenches 250 (FIG. 10D) are covered by the patterned hard mask layer 236-1, the semiconductor layer 239 is only deposited in the source/drain trenches 250' (FIGS. 10B, 10C). The semiconductor layer 239 is deposited to a thickness such that it is near the bottom of the stack 205 (FIG. 10B) and is about level with the top surface of the isolation features 230 (FIG. 10C). The operation 112 may include an etching process that recesses the semiconductor layer 239 to the level shown in FIGS. 10B and 10C if the semiconductor layer 239 is initially grown taller than that.

At operation 114, the method 100 (FIG. 2A) removes the patterned hard mask layer 236-1 by one or more etching processes. The resultant structure is shown in FIGS. 11A-11D according to an embodiment. FIG. 11A illustrates a top view of the device 200, and FIGS. 11B, 11C, and 11D illustrate cross-sectional views of the device 200, in portion, along the B-B line, the C-C line, and the D-D line in FIG. 11A, respectively. In an embodiment, operation 114 performs one or more etching processes that are selective to the materials in the hard masks 236-1, and with no (or minimal) etching to the gate spacers 247, the gate hard mask 246, the inner spacers 255, the semiconductor layers 215, 239, and 204, and various other features that are exposed as a result of the removal of the hard masks 236-1. The etching processes can be dry etching, wet etching, reactive ion etching, or other suitable etching.

Figure 2A:
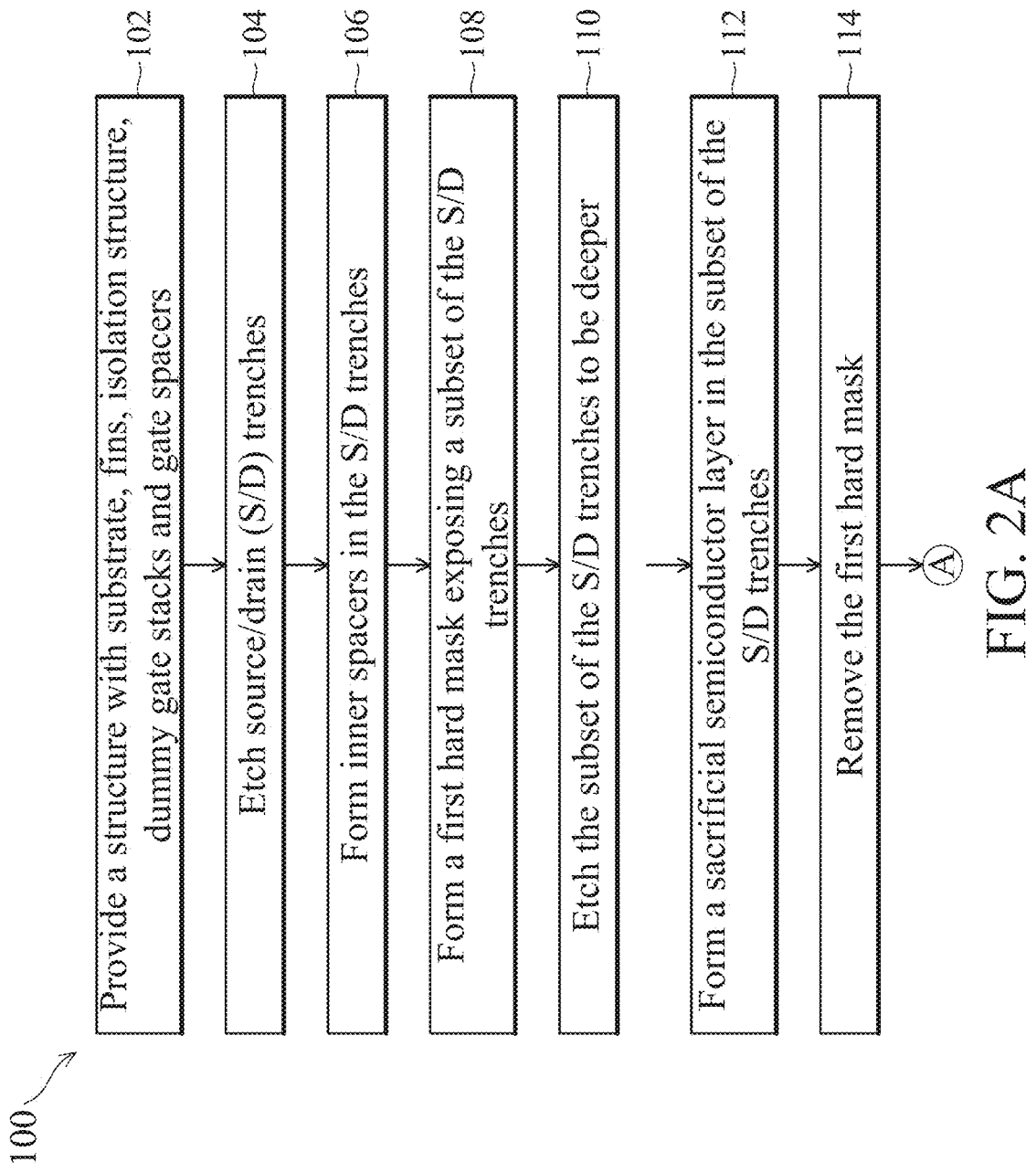
FIGS. 2A, 2B, 2C, and 2D show a flow chart of a method of forming a semiconductor device, according to various aspects of the present disclosure.
Figure 2B:
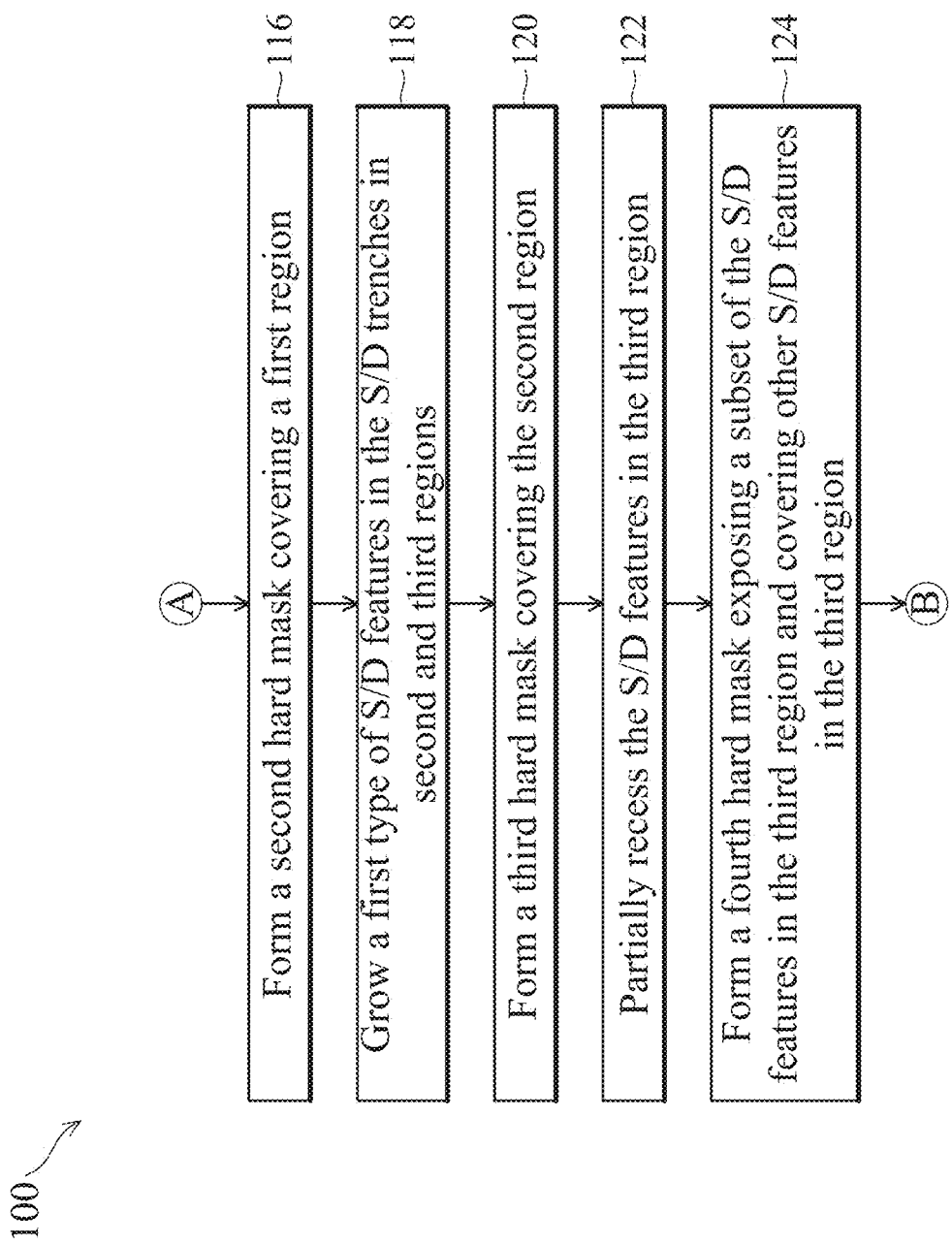
Figure 2C:
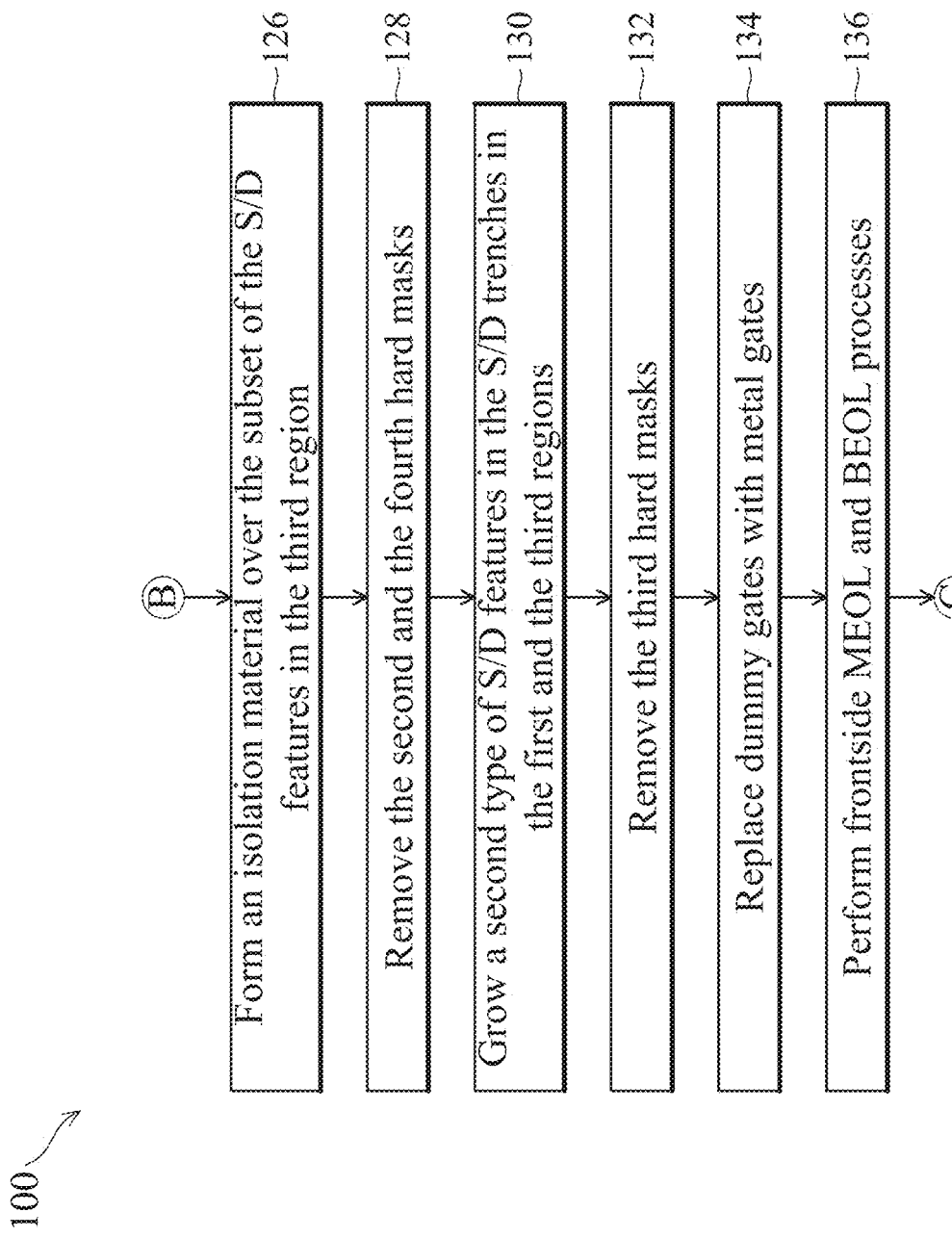
Figure 2D:
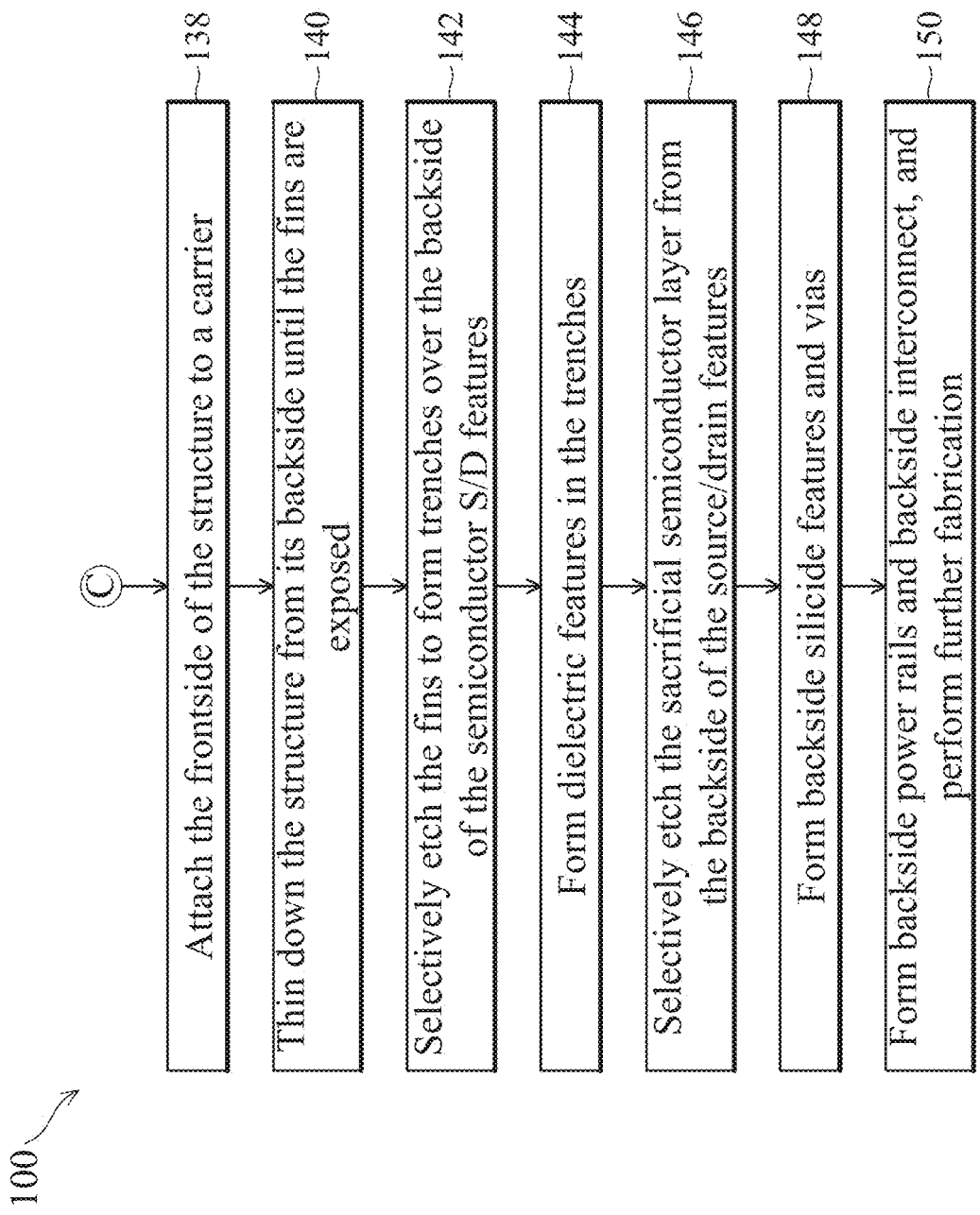
Figure 12:
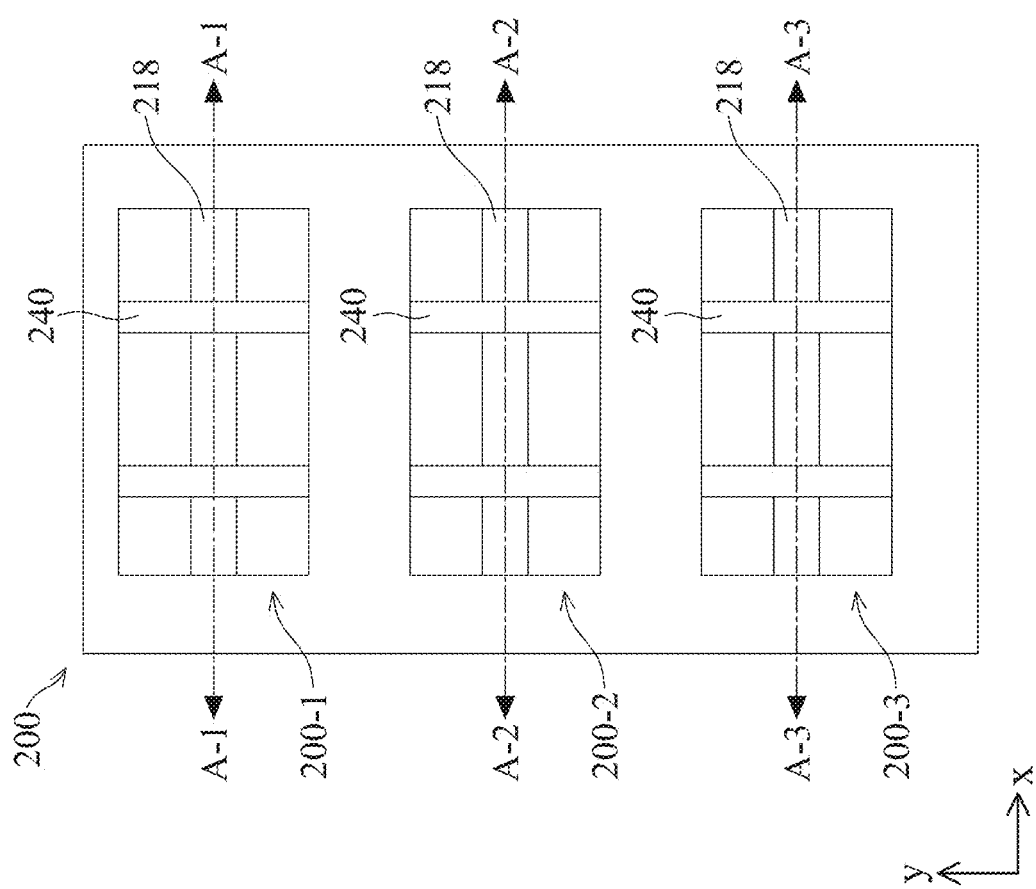

The operations 116 through 132 of the method 100 in FIGS. 2B and 2C are performed to various regions of the device 200. Three example regions 200-1, 200-2, and 200-3 are illustrated in FIG. 12. In various embodiments, these regions 200-1, 200-2, and 200-3 may abut one another or are spaced away from each other in the device 200. All the regions 200-1, 200-2, and 200-3 have gone through the operations 102 through 114. The region 200-1 will be formed to have a second type of source/drain features (such as n-type doped source/drain features), the region 200-2 will be formed to have a first type of source/drain features (such as p-type doped source/drain features), and the region 200-3 will be formed to have the second type of source/drain features stacked over the first type of source/drain features. The first type is opposite to the second type in terms of conductivity. In an embodiment, the first type is p-type and the second type is n-type. In an alternative embodiment, the first type is n-type and the second type is p-type. By using the three regions 200-1, 200-2, and 200-3, the present disclosure demonstrates that embodiments of the method 100 can be used to make PMOS transistors, NMOS transistors, and stacked CMOS transistors simultaneously on the same wafer. In the following discussion, FIGS. 13A-1, 14A-1, 15A-1, 16A-1, 17A-1, 18A-1, 19A-1, 20A-1, and 21A-1 show cross-sectional views of the device 200 in the region 200-1 along the A-1-A-1 line in FIG. 12 during various fabrication steps of method 100; FIGS. 13A-2, 14A-2, 15A-2, 16A-2, 17A-2, 18A-2, 19A-2, 20A-2, and 21A-2 show cross-sectional views of the device 200 in the region 200-2 along the A-2-A-2 line in FIG. 12 during various fabrication steps of method 100; and FIGS. 13A-3, 14A-3, 15A-3, 16A-3, 17A-3, 18A-3, 19A-3, 20A-3, and 21A-3 show cross-sectional views of the device 200 in the region 200-3 along the A-3-A-3 line in FIG. 12 during various fabrication steps of method 100.

At operation 116, the method 100 (FIG. 2B) forms a hard mask 236-2 covering the first region 200-1 and exposing the second region 200-2 and the third region 200-3. The resultant structures of the three regions 200-1, 200-2, and 200-3 are shown in FIGS. 13A-1, 13A-2, and 13A-3, respectively, according to an embodiment. The hard mask 236-2 may be formed in the same way as the hard mask 236-1 (see discussion of operation 108 and FIGS. 8B and 10B for example), such as by deposition, photolithography, and etching processes. For simplicity, the resist pattern that is used to etch and form the hard mask 236-2 is not shown (or has been stripped away) in FIGS. 13A-1, 13A-2, and 13A-3.

Figures 1, 2, 3, 13A:
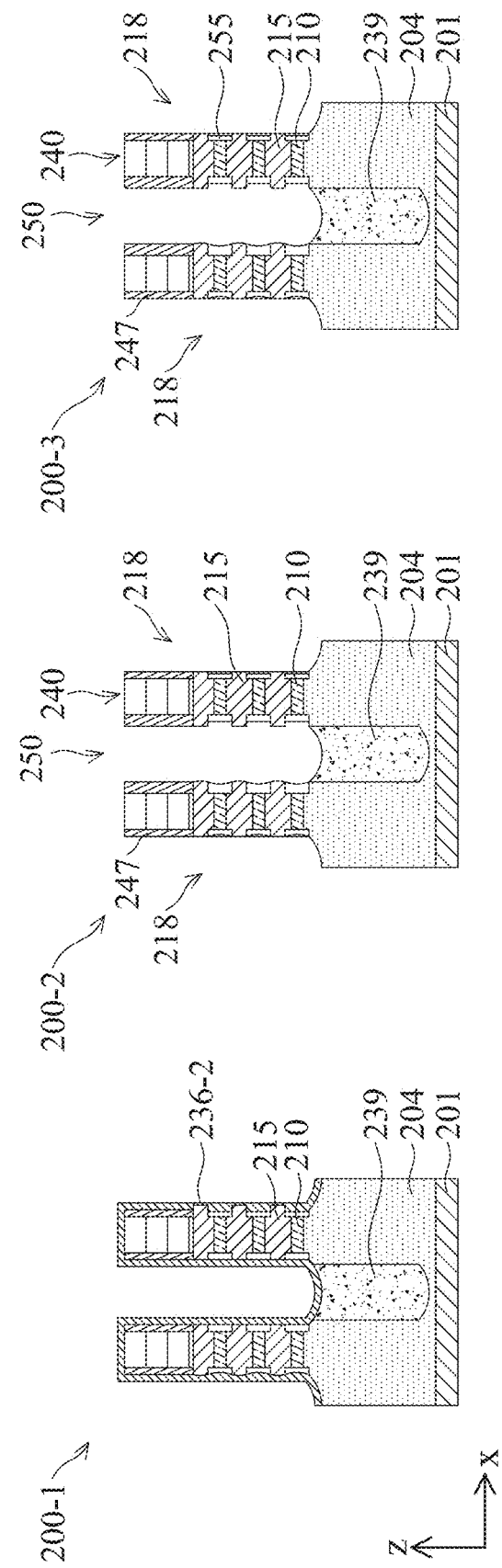
Figures 1, 2, 3, 18A:
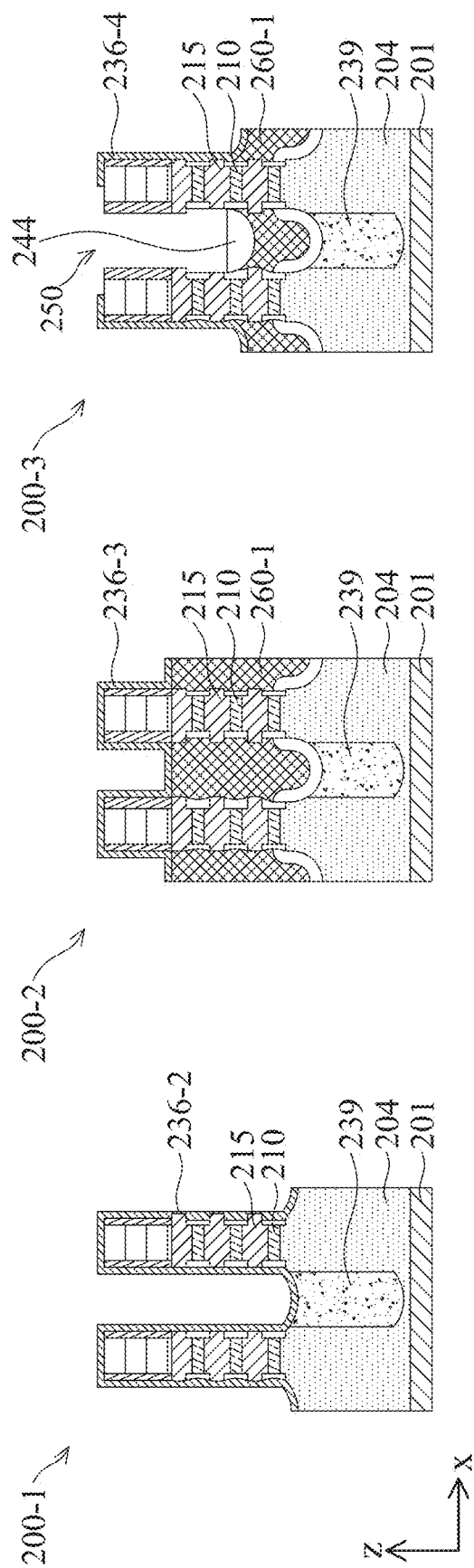
Figures 1, 2, 3, 19A:
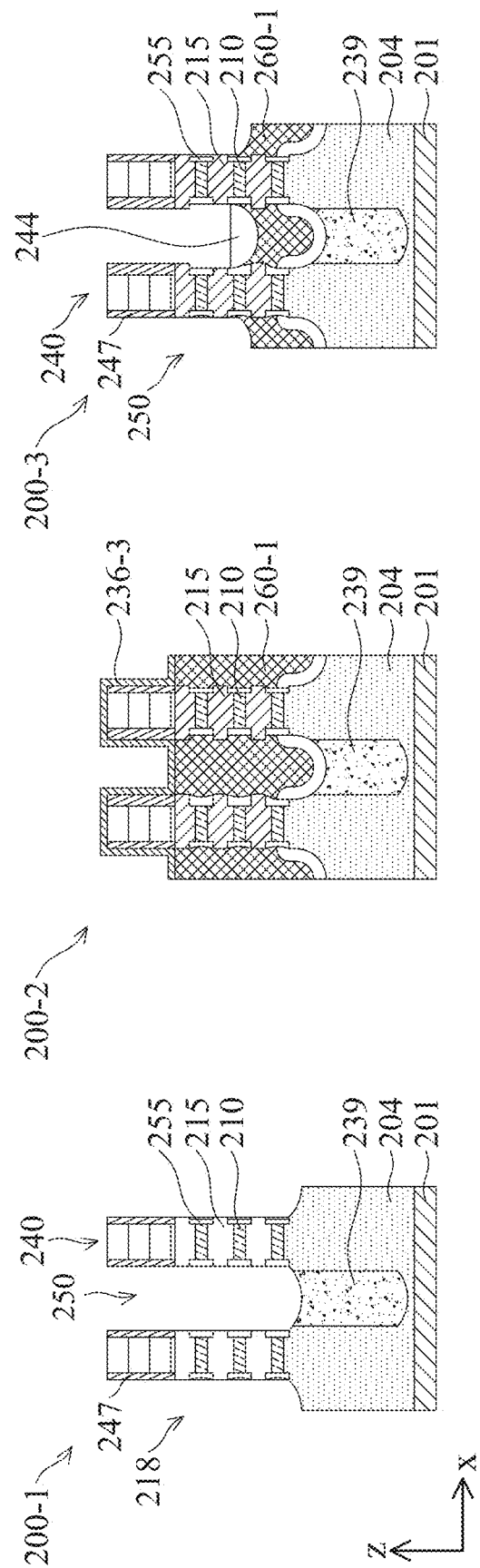

At operation 118, the method 100 (FIG. 2B) grows semiconductor S/D features 260-1 in the S/D trenches 250 in the second region 200-2 and the third region 200-3 while the hard mask 236-2 covers the first region 200-1. The resultant structures of the three regions 200-1, 200-2, and 200-3 are shown in FIGS. 14A-1, 14A-2, and 14A-3, respectively, according to an embodiment. As shown in FIGS. 14A-2 and 14A-3, epitaxial S/D features 260-1 are grown from the semiconductor layers 204, 239, and 215 at the S/D trenches 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 239, and 215. Epitaxial S/D features 260-1 are doped with n-type dopants for n-type transistors or p-type dopants for p-type transistors. In some embodiments, for n-type transistors, epitaxial S/D features 260-1 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260-1 include silicon germanium or germanium and can be doped with boron, other p-type dopant, or combinations thereof (for example, forming Si:Ge:B epitaxial source/drain features). In some embodiments, epitaxial S/D features 260-1 include more than one epitaxial semiconductor layer, where the epitaxial semiconductor layers can include the same or different materials and/or dopant concentrations. Further, in an embodiment, the S/D feature 260-1 (or at least its portion adjoining to the semiconductor layer 239) includes a different material composition than the semiconductor layer 239 to achieve etch selectivity during backside via formation process. For example, in an embodiment, the semiconductor layer 239 include SiGe and the S/D feature 260-1 includes Si (for n-type transistor). For example, in another embodiment, the semiconductor layer 239 include SiGe with a first Ge atomic percent and the S/D feature 260-1 includes SiGe (for p-type transistor) with a second Ge atomic percent and the first and the second Ge atomic percent are different. In some embodiments, epitaxial S/D features 260-1 include materials and/or dopants that achieve desired tensile stress and/or compressive stress in respective channel regions. In some embodiments, epitaxial source/drain features 260-1 are doped during deposition by adding impurities to a source material of the epitaxy process (i.e., in-situ). In some embodiments, epitaxial source/drain features 260-1 are doped by an ion implantation process subsequent to a deposition process. In some embodiments, annealing processes (e.g., rapid thermal annealing (RTA) and/or laser annealing) are performed to activate dopants in epitaxial source/drain features 260-1.

At operation 120, the method 100 (FIG. 2B) forms a hard mask 236-3 covering the second region 200-2 and exposing the first region 200-1 and the third region 200-3. The first region 200-1 is still covered by the hard mask 236-2. The resultant structures of the three regions 200-1, 200-2, and 200-3 are shown in FIGS. 15A-1, 15A-2, and 15A-3, respectively, according to an embodiment. The hard mask 236-3 may be formed in the same way as the hard mask 236-1 (see discussion of operation 108 and FIGS. 8B and 10B for example), such as by deposition, photolithography, and etching processes. Further, the hard mask 236-3 includes a different material than the hard mask 236-2 to achieve etch selectivity. For simplicity, the resist pattern that is used to etch and form the hard mask 236-3 is not shown (or has been stripped away) in FIGS. 15A-1, 15A-2, and 15A-3.

At operation 122, the method 100 (FIG. 2B) partially recesses the S/D features 260-1 in the third region 200-3 while the hard masks 263-2 and 263-3 cover the regions 200-1 and 200-2 respectively. The resultant structures of the three regions 200-1, 200-2, and 200-3 are shown in FIGS. 16A-1, 16A-2, and 16A-3, respectively, according to an embodiment. The S/D features 260-1 may be recessed by dry etching, wet etching, reactive ion etching, or other suitable etching. The etching process is tuned selective to the material of the semiconductor layer 260-1 and with no (or minimal) etching to the etch masks 236-2 and 236-3, the inner spacers 255, the gate spacers 247, and other features including the dummy dielectric fins 229, the gate hard mask layers 246, and the isolation structure 230. The S/D features 260-1 in the third region 200-3 are recessed to recover a portion of the S/D trenches 250 such that one or more channel layers 215 are exposed in the S/D trenches 250. Further, the S/D features 260-1 in the third region 200-3 are only partially recessed such that one or more channel layers 215 (including the bottommost channel layer 215) are still connected between the S/D features 260-1. The depth of recessing of the S/D features 260-1 may be controlled by timer or other means in various embodiments.

At operation 124, the method 100 (FIG. 2B) forms a hard mask 236-4 exposing a subset of the S/D features 260-1 in the third region 200-3 and covering other S/D features 260-1 in the third region 200-3. The first and the second regions 200-1 and 200-2 are still covered by the hard masks 236-2 and 236-3, respectively. The resultant structures of the three regions 200-1, 200-2, and 200-3 are shown in FIGS. 17A-1, 17A-2, and 17A-3, respectively, according to an embodiment. The hard mask 236-4 may be formed in the same way as the hard mask 236-1 (see discussion of operation 108 and FIGS. 8B and 10B for example), such as by deposition, photolithography, and etching processes. In the present embodiment, the hard mask 236-4 includes a same or similar material as the hard mask 236-2 so that they can be removed by the same etching process. Further, the hard mask 236-4 includes a different material than the hard mask 236-3 to achieve etch selectivity. For simplicity, the resist pattern that is used to etch and form the hard mask 236-4 is not shown (or has been stripped away) in FIGS. 17A-1, 17A-2, and 17A-3. In the present embodiment, the mask 263-4 exposes some or all of the S/D features 260-1 that are disposed directly over the semiconductor layer 239 (i.e., those S/D features 260-1 that will be connected to backside vias). The mask 263-4 may also expose some of the S/D features 260-1 that are not disposed directly over the semiconductor layer 239 (i.e., those S/D features 260-1 that will not be connected to backside vias) in some embodiments.

At operation 126, the method 100 (FIG. 2C) form an isolation layer 244 over the subset of the S/D features 260-1 in the third region 200-3 that are exposed through the hard mask 263-4. The resultant structures of the three regions 200-1, 200-2, and 200-3 are shown in FIGS. 18A-1, 18A-2, and 18A-3, respectively, according to an embodiment. In an embodiment, the isolation layer 244 is initially deposited over the hard masks 236-2, 236-3, and 236-4, and is subsequently removed from the hard masks 236-2, 236-3, and 236-4 by one or more etching processes. In the present embodiment, the isolation layer 244 is deposited to a level such that some of the channel layers 215 are still exposed in the S/D trenches 250 and above the isolation layer 244. In some embodiment, the isolation layer 244 may block (or cover) some, but not all, of the channel layers 215 in the S/D trenches 250. In an embodiment, the isolation layer 244 includes a dielectric material that includes silicon, oxygen, carbon, nitrogen, other suitable material, or combinations thereof (for example, silicon dioxide ($SiO_2$), silicon nitride ($Si_3N_4$), silicon oxynitride (SiON), silicon carbonitride (SiCN), or silicon oxycarbonitride (SiOCN)). The isolation layer 244 may be deposited by CVD, PVD, ALD, or other suitable methods.

At operation 128, the method 100 (FIG. 2C) removes the hard masks 236-2 and 236-4, while keeping the hard mask 236-3 over the second region 200-2. The resultant structures of the three regions 200-1, 200-2, and 200-3 are shown in FIGS. 19A-1, 19A-2, and 19A-3, respectively, according to an embodiment. In an embodiment, operation 128 performs one or more etching processes that are selective to the materials in the hard masks 236-2 and 236-4, and with no (or minimal) etching to the hard mask 236-3, the gate spacers 247, the gate hard mask 246, the inner spacers 255, the isolation layer 244, the S/D features 260-1, and various other features that are exposed as a result of the removal of the hard masks 236-2 and 236-4. The etching processes can be dry etching, wet etching, reactive ion etching, or other suitable etching. The operation 128 recovers the S/D trenches 250 in the first region 200-1 and the third region 200-3.

Figures 1, 2, 3, 20A:
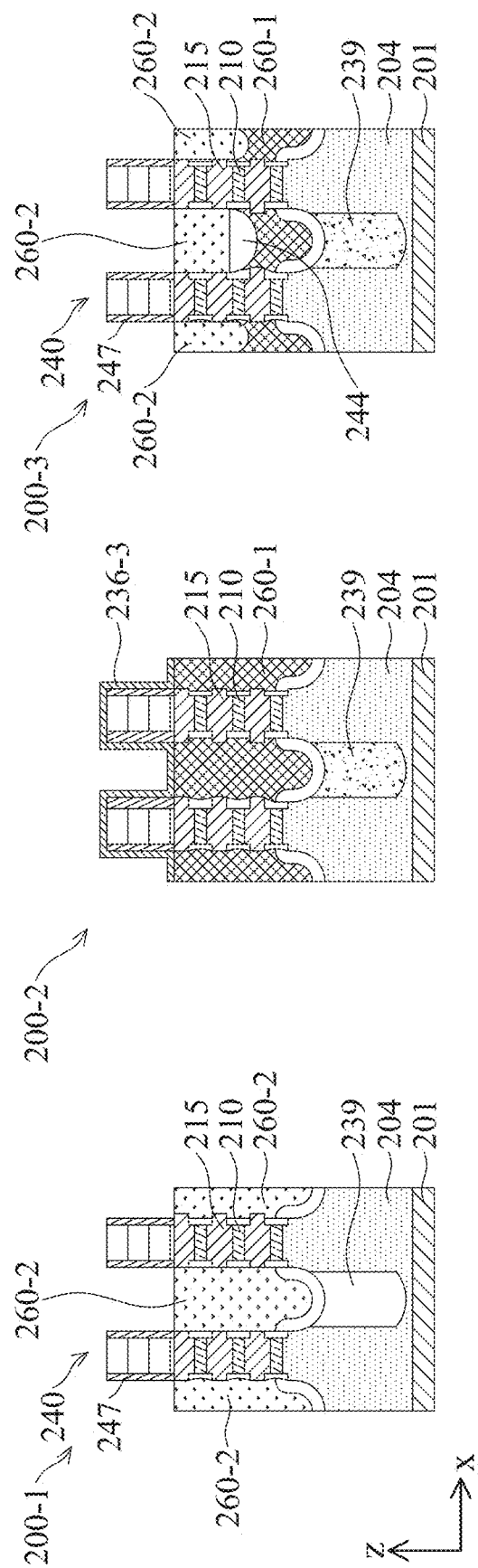

At operation 130, the method 100 (FIG. 2C) grows semiconductor S/D features 260-2 in the S/D trenches 250 in the first region 200-1 and the third region 200-3 while the hard mask 236-3 covers the second region 200-2. The resultant structures of the three regions 200-1, 200-2, and 200-3 are shown in FIGS. 20A-1, 20A-2, and 20A-3, respectively, according to an embodiment. As shown in FIGS. 20A-1, epitaxial S/D features 260-2 are grown from the semiconductor layers 204, 239, and 215 at the S/D trenches 250. As shown in FIGS. 20A-3, epitaxial S/D features 260-2 are grown from the semiconductor layers 260-1 and 215 at the S/D trenches 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 239, 215, and 260-1. Epitaxial S/D features 260-2 are doped with n-type dopants for n-type transistors or p-type dopants for p-type transistors. In some embodiments, for n-type transistors, epitaxial S/D features 260-2 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260-2 include silicon germanium or germanium and can be doped with boron, other p-type dopant, or combinations thereof (for example, forming Si:Ge:B epitaxial source/drain features). In some embodiments, epitaxial S/D features 260-2 include more than one epitaxial semiconductor layer, where the epitaxial semiconductor layers can include the same or different materials and/or dopant concentrations. Further, in an embodiment, the S/D feature 260-2 (or at least its portion adjoining to the semiconductor layer 239) includes a different material composition than the semiconductor layer 239 to achieve etch selectivity during backside via formation process. For example, in an embodiment, the semiconductor layer 239 include SiGe and the S/D feature 260-2 includes Si (for n-type transistor). For example, in another embodiment, the semiconductor layer 239 include SiGe with a first Ge atomic percent and the S/D feature 260-2 includes SiGe (for p-type transistor) with a second Ge atomic percent and the first and the second Ge atomic percent are different. In some embodiments, epitaxial S/D features 260-2 include materials and/or dopants that achieve desired tensile stress and/or compressive stress in respective channel regions. In some embodiments, epitaxial S/D features 260-2 are doped during deposition by adding impurities to a source material of the epitaxy process (i.e., in-situ). In some embodiments, epitaxial S/D features 260-2 are doped by an ion implantation process subsequent to a deposition process. In some embodiments, annealing processes (e.g., rapid thermal annealing (RTA) and/or laser annealing) are performed to activate dopants in epitaxial S/D features 260-2. In the present embodiment, the S/D features 260-2 have a different conductivity than the S/D features 260-1 so that stacked CMOS structures are formed in the region 200-3. In an embodiment, the S/D features 260-1 are of p-type conductivity, and the S/D features 260-2 are of n-type conductivity. In another embodiment, the S/D features 260-1 are of n-type conductivity, and the S/D features 260-2 are of p-type conductivity. Referring to FIG. 20A-3, some of the S/D features 260-2 are directly connected to S/D features 260-1. These can function as common (or shared) drain feature or common source feature. Some of the S/D features 260-2 are isolated from S/D features 260-1 by the isolation layer 244. These S/D features 260-2 and 260-1 function as individual (not shared) source features or individual drain features.

At operation 132, the method 100 (FIG. 2C) removes the hard masks 236-3 from the second region 200-2. The resultant structures of the three regions 200-1, 200-2, and 200-3 are shown in FIGS. 21A-1, 21A-2, and 21A-3, respectively, according to an embodiment. In an embodiment, operation 132 performs one or more etching processes that are selective to the materials in the hard masks 236-3, and with no (or minimal) etching to the gate spacers 247, the gate hard mask 246, the S/D features 260-1 and 260-2, and various other features that are exposed as a result of the removal of the hard mask 236-3. The etching processes can be dry etching, wet etching, reactive ion etching, or other suitable etching. As shown in FIGS. 21A-1, 21A-2, and 21A-3, a first type of S/D features 260-1 are formed in the second region 200-2, a second type of S/D features 260-2 are formed in the first region 200-1, and both the first and the second types of S/D features 260-1 and 260-2 are formed as a stacked structure in the third region 200-3.

At operations 134 and 136, the method 100 (FIG. 2C) replaces dummy gates 240 with functional gates and performs mid-end-of-line (MEOL) and back-end-of-line (BEOL) processes to the frontside of the substrate 201. At operations 138 through 150, the method 100 (FIG. 2D) performs fabrication to the backside of the substrate 201. The operations 134 through 150 are performed in a same manner to the regions 200-1, 200-2, and 200-3, with the understanding that different transistors may be formed with gates of different work functions. For simplicity, the region 200-3 is illustrated in FIGS. 22A through 30 to describe the various operations 134 through 150 with the understanding that the same or similar structures are formed in the regions 200-1 and 200-2.

Figure 22A:
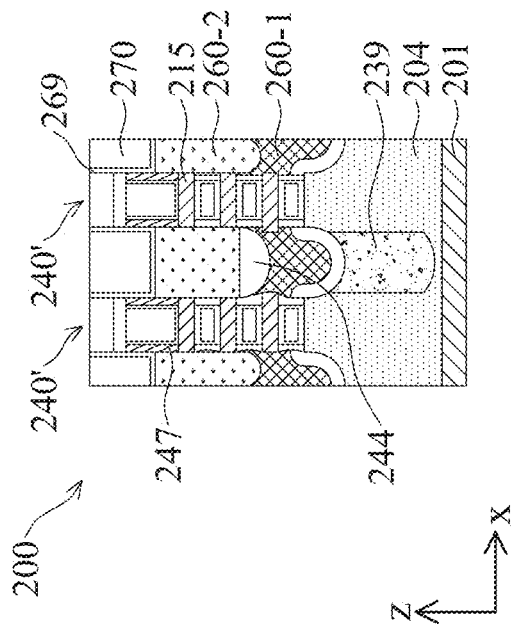
Figure 22B:
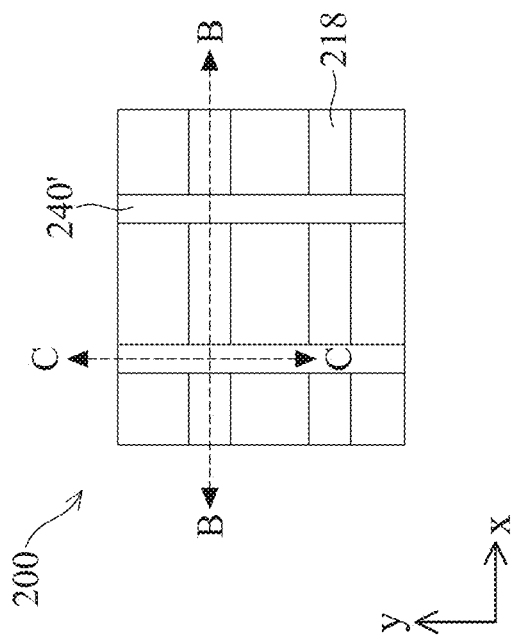
Figure 22C:
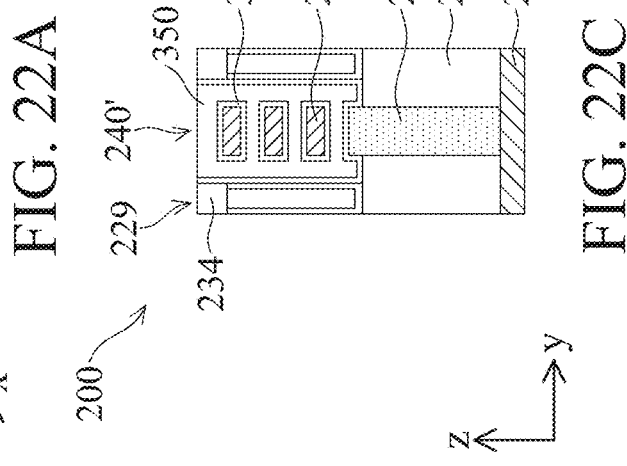

At operation 134, the method 100 (FIG. 2C) forms a contact etch stop layer (CESL) 269 and an inter-layer dielectric (ILD) layer 270 in the device 200 and over all three regions 200-1, 200-2, and 200-3, and then replaces the dummy gate stacks 240 with functional gate stack 240' (such as high-k metal gates). The resultant structure is shown in FIGS. 22A-22C according to an embodiment. FIG. 22A illustrates a top view of the device 200 (region 200-3), and FIGS. 22B and 22C illustrate cross-sectional views of device 200, in portion, along the B-B line and the C-C line in FIG. 22A, respectively.

As shown in FIG. 22B, the CESL 269 is deposited over the S/D features 260-2, and the ILD layer 270 is deposited over the CESL 269 and fills the space between opposing gate spacers 247. The CESL 269 includes a material that is different than ILD layer 270 and different than the dielectric layer 234. The CESL 269 may include $La_2O_3$, $Al_2O_3$, SiOCN, SiOC, SICN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise TEOS formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate stacks 240. In some embodiments, the planarization process removes hard mask layers 246 of dummy gate stacks 240 to expose underlying dummy gate electrodes 245, such as polysilicon gate electrode layers.

Subsequently, the operation 134 removes the dummy gate stacks 240 (the dummy gate electrodes 245 and the dummy gate dielectric layer 235, see FIG. 5B) using one or more etching process. This forms gate trenches. The etching process may be a dry etching process, a wet etching process, other suitable etching process, or combinations thereof. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 270, gate spacers 247, isolation features 230, cladding layer 231, semiconductor layers 215, and semiconductor layers 210.

Next, the operation 134 removes the cladding layer 231 (see FIG. 5C) exposed in the gate trenches. The etching process may selectively etch the cladding layer 231 with minimal (to no) etching of semiconductor layers 215, gate spacers 247, and inner spacers 255. Next, the operation 134 removes the semiconductor layers 210 exposed in the gate trenches, leaving the semiconductor layers 215 suspended over the semiconductor layer 204 and connected with the S/D features 260-1 and 260-2. This process is also referred to as a channel release process and the semiconductor layers 215 are also referred to as channel layers. The etching process selectively etches semiconductor layers 210 with minimal (to no) etching of semiconductor layers 215 and, in some embodiments, minimal (to no) etching of gate spacers 247 and/or inner spacers 255.

Next, the operation 134 forms a gate dielectric layer 349 that wraps around each of the semiconductor layers 215 and forms a gate electrode 350 over the gate dielectric layer 349. The functional gate stack 240' comprises the gate dielectric layer 349 and the gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TIO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof. The gate dielectric layer 349 may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer (depending on the type of transistors) and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240' includes a high-k dielectric layer and metal layer(s), it is also referred to as a high-k metal gate.

Figure 23:
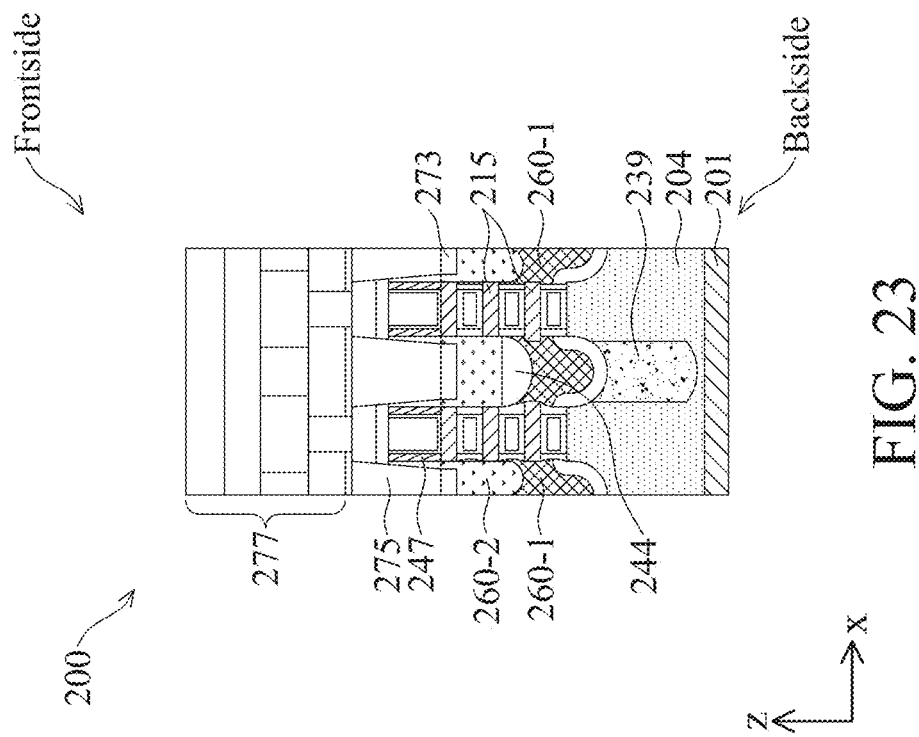

At operation 136, the method 100 (FIG. 2C) performs mid-end-of-line (MEOL) and back-end-of-line (BEOL) processes at the frontside of the substrate 201. The resultant structure is shown in FIG. 23 according to an embodiment. FIGS. 23 through 30 illustrate cross-sectional views of the device 200 along the B-B line in FIG. 22A, according to some embodiment. In an embodiment, the operation 136 etches S/D contact holes to expose some of the S/D features 260-2 in regions 200-1 and 200-3 and some of the S/D features 260-1 in region 200-2. The S/D features 260-2 and 260-1 may be partially etched in some embodiments. The etching processes can be dry etching, wet etching, reactive ion etching, or other etching methods. Then, the operation 136 forms silicide features 273 over the S/D features 260-2 and 260-1 and form S/D contacts (or vias) 275 over the silicide features 273. Since the silicide features 273 and the S/D contacts 275 are formed at the frontside of the device 200, they are also referred to as frontside silicide features 273 and frontside S/D contacts 275 respectively.

The silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 275.

The operation 136 may also form gate vias connecting to the gate stacks 240', form S/D contact vias connecting to the S/D contacts 275, and form one or more interconnect layers with wires and vias embedded in dielectric layers. The one or more interconnect layers connecting gate, source, and drain electrodes of various transistors, as well as other circuits in the device 200, to form an integrated circuit in part or in whole. The operation 136 may also form passivation layer(s) over the interconnect layers. In the example shown in FIG. 23, a layer 277 is used to denote various dielectric and metal layers including interconnect layers and passivation layers formed at the frontside of the device 200 over the S/D contacts 275.

Figure 24:
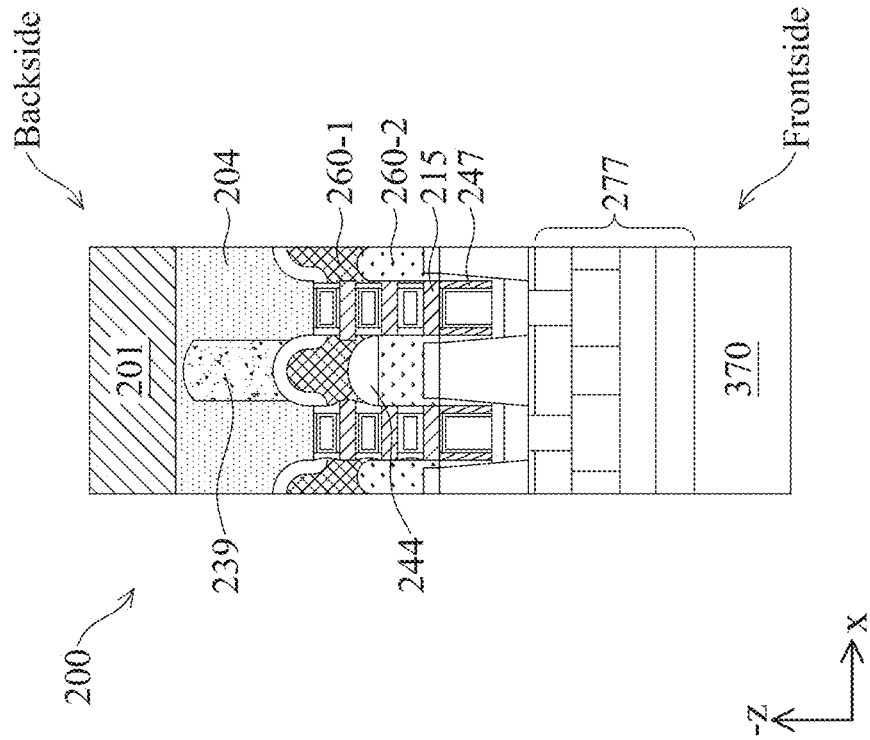

At operation 138, the method 100 (FIG. 2D) flips the device 200 upside down and attaches the frontside of the device 200 to a carrier 370, such as shown in FIG. 24. This makes the device 200 accessible from the backside of the device 200 for further processing. The operation 138 may use any suitable attaching processes, such as direct bonding, hybrid bonding, using adhesive, or other bonding methods. The operation 138 may further include alignment, annealing, and/or other processes. The carrier 370 may be a silicon wafer in some embodiment. In the figure of the present disclosure including FIGS. 24 through 30, the "z" direction points from the backside of the device 200 to the frontside of the device 200, while the "−z" direction points from the frontside of the device 200 to the backside of the device 200.

Figure 25:
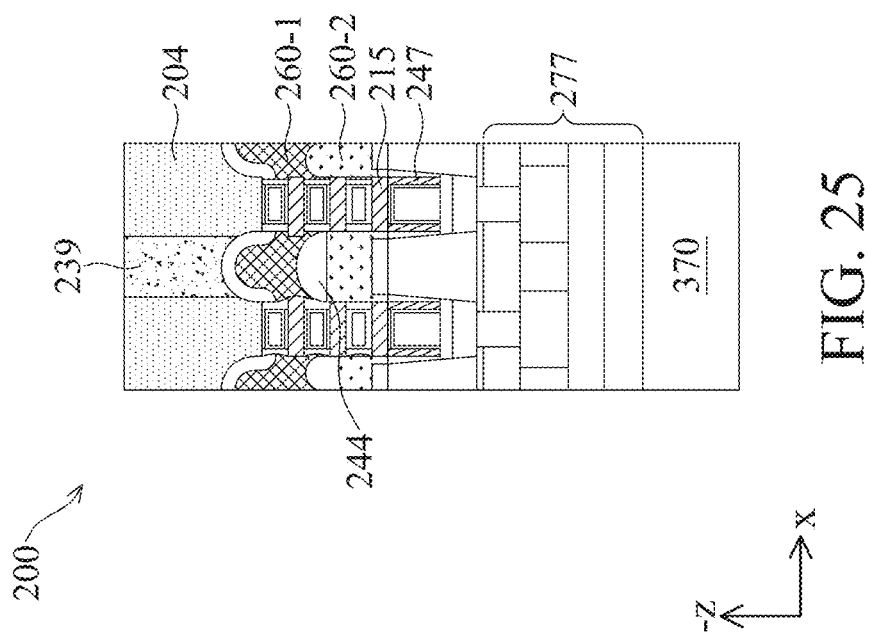

At operation 140, the method 100 (FIG. 2D) thins down the device 200 from the backside of the device 200 until the semiconductor layer 204, the semiconductor layer 239, and the isolation features 230 (see FIG. 22C) are exposed from the backside of the device 200. The resultant structure is shown in FIG. 25 according to an embodiment. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

Figure 26:
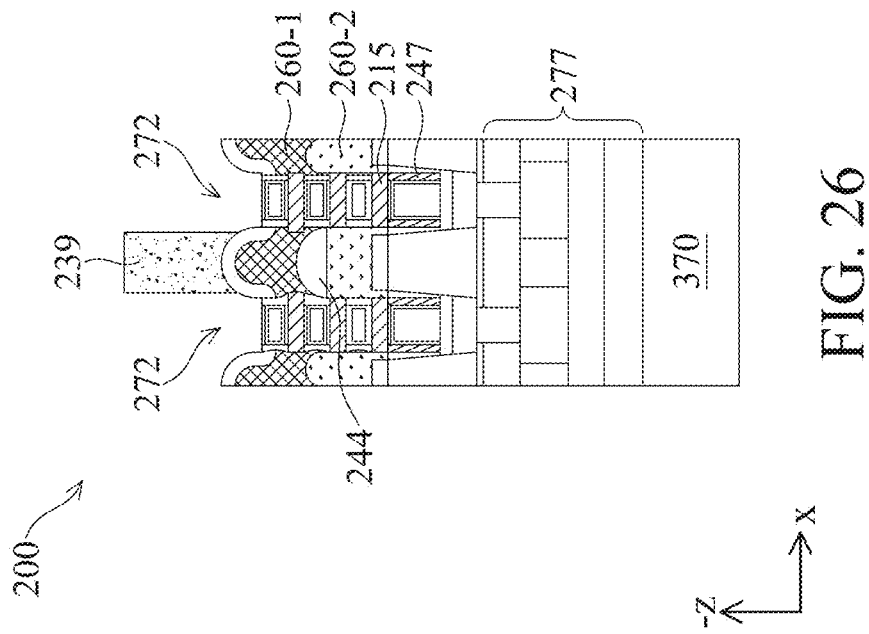

At operation 142, the method 100 (FIG. 2D) selectively etches the semiconductor layer 204 to form trenches 272 over the backside of the gate stacks 240' and the S/D features 260-1 in the regions 200-2 and 200-3 and 260-2 in the region 200-1. The resultant structure is shown in FIG. 26 according to an embodiment. In the present embodiment, the operation 142 applies an etching process that is tuned to be selective to the materials of the semiconductor layer 204 and with no (or minimal) etching to the semiconductor layer 239, the S/D features 260-1 and 260-2, the gate stacks 240', and the isolation features 230. The etching process can be dry etching, wet etching, reactive ion etching, or other etching methods.

Figure 27:
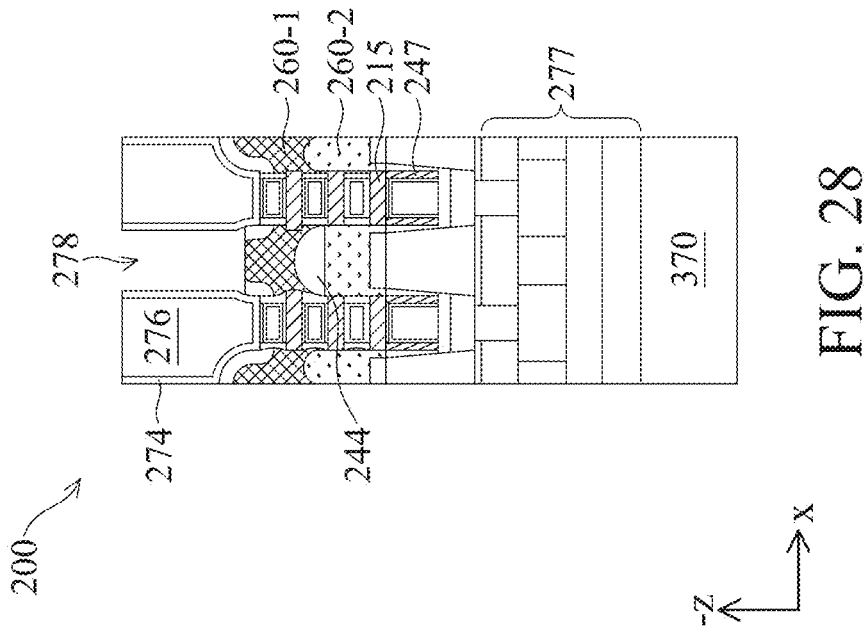

At operation 144, the method 100 (FIG. 2D) forms one or more dielectric layers to fill the trenches 272. For example, the one or more dielectric layers may include a dielectric liner 274 and one or more dielectric layers 276. The resultant structure is shown in FIG. 27 according to an embodiment. In some embodiments, the dielectric liner 274 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. In some embodiments, the dielectric layer(s) 276 may comprise TEOS formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by PECVD (plasma enhanced CVD), FCVD (flowable CVD), or other suitable methods.

Figure 28:
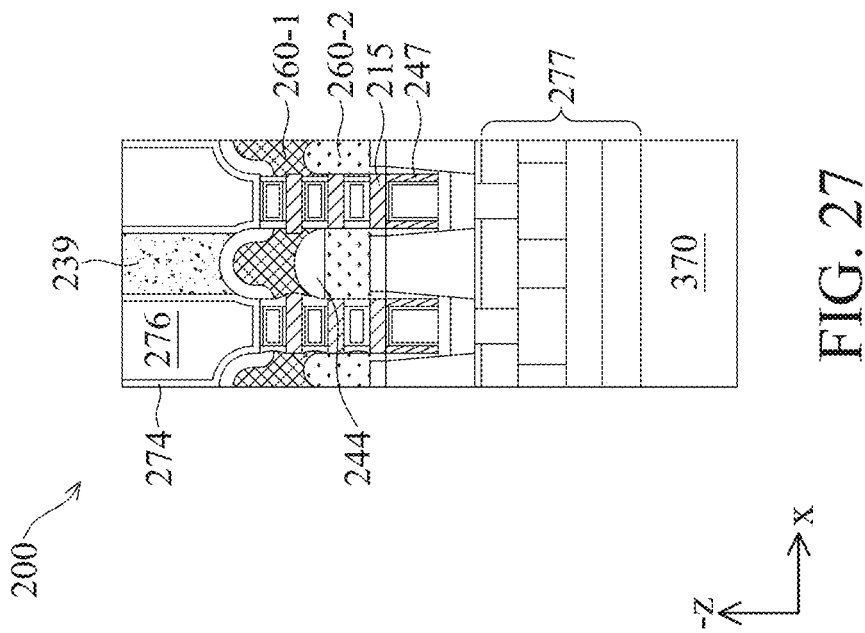

At operation 146, the method 100 (FIG. 2D) removes the semiconductor layer 239 from the backside of the device 200. The resultant structure is shown in FIG. 28 according to an embodiment. In the present embodiment, the operation 146 applies an etching process that is tuned to be selective to the materials of the semiconductor layer 239 (such as SiGe in an embodiment) and with no (or minimal) etching to the dielectric liner 274, the dielectric layer(s) 276, and the isolation features 230. The etching process may not etch the S/D feature 260-1 and 260-2 in some embodiment and may partially etch the S/D feature 260-1 and 260-2 in some alternative embodiment. The etching process results in trenches 278 that expose some of the S/D features 260-1 in regions 200-2 and 200-3 and some of the S/D features 260-2 in region 200-1 from the backside of the device 200. The etching process can be dry etching, wet etching, reactive ion etching, or other etching methods. Particularly, in the present embodiment, the etching of the semiconductor layer 239 is self-aligned. In other words, the operation 146 does not need to make an etch mask (e.g., an etch mask formed by photolithography processes) in order to etch the semiconductor layer 239. Rather, it relies on the etch selectivity of the materials in the semiconductor layer 239 and its surrounding layers. This beneficially forms the trenches 278 to be aligned with the underlying S/D features 260-1 and 260-2 without misalignments such as those introduced by photolithography overlay shift. Using this process will result in backside contacts (or vias) that are ideally aligned with the S/D features 260-1 and 260-2, as will be discussed below.

Figure 29:
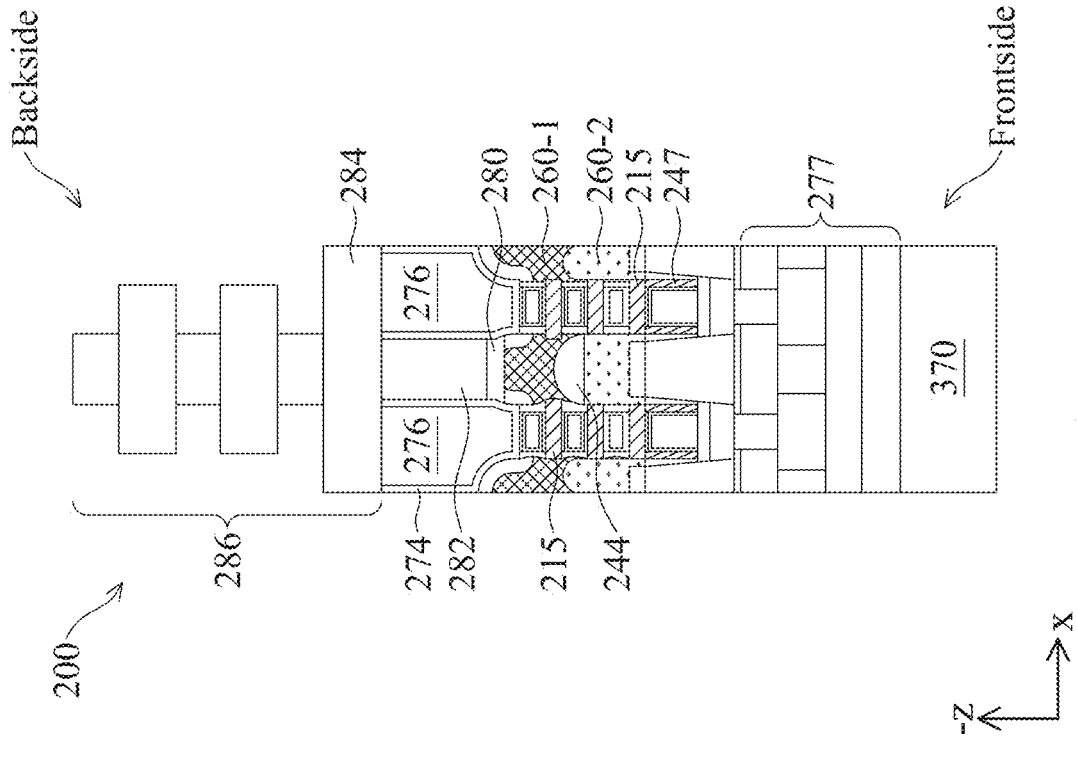

At operation 148, the method 100 (FIG. 2D) forms backside source silicide features 280 and backside contacts (or vias or metal plugs) 282 in the trenches (or via holes) 278. The resultant structure is shown in FIG. 29 according to an embodiment. In an embodiment, the operation 149 deposits one or more metals into the via holes 278, performing an annealing process to the device 200 to cause reaction between the one or more metals and the S/D features 260-1 (such as in regions 200-2 and 200-3) and 260-2 (such as in region 200-1) to produce the silicide features 280, and removing un-reacted portions of the one or more metals, leaving the silicide features 280 in the via hole. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Then, the operation 148 deposits the via 282 in the via hole 278 and contacting the silicide feature 280. In an embodiment, the via 282 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

Figure 30:
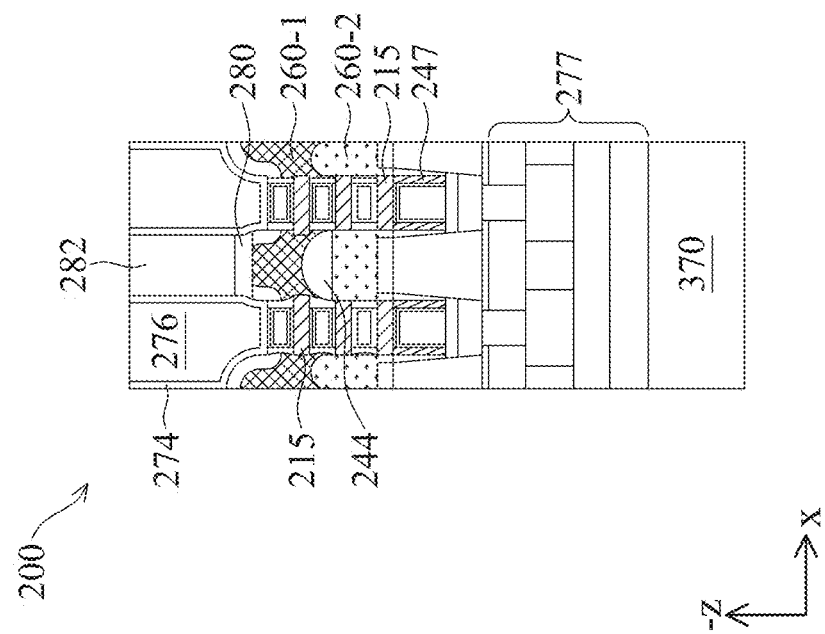
Figure 31:
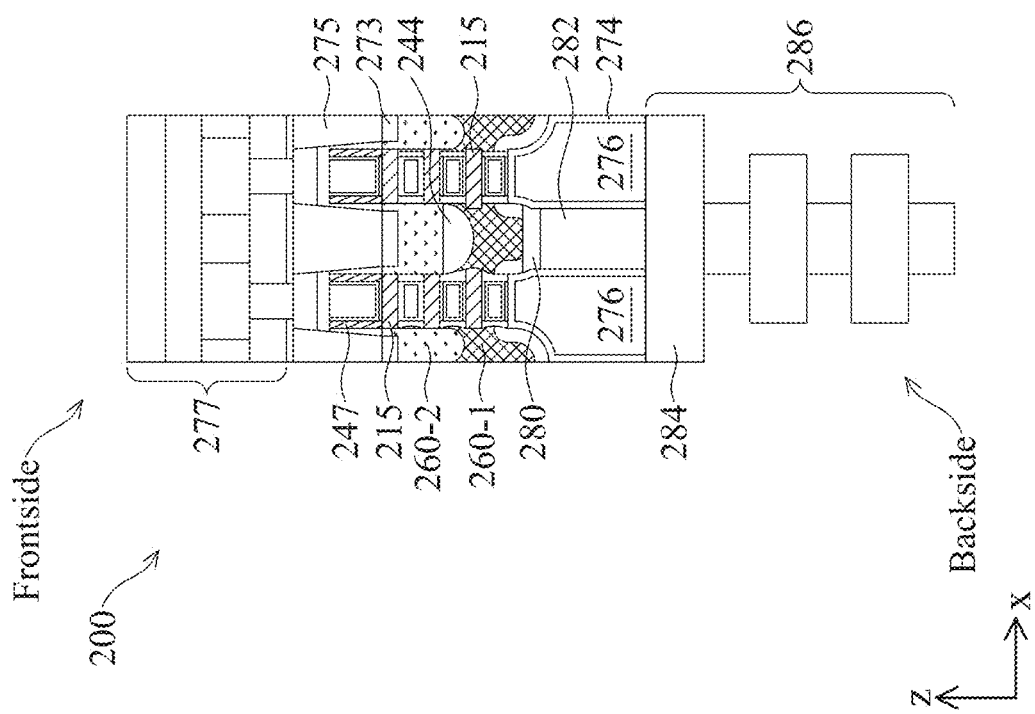

At operation 150, the method 100 (FIG. 2D) performs further fabrications to the device 200. For example, the operation 150 forms backside power rails 284 and a backside interconnect 286. The resultant structure is shown in FIG. 30 according to an embodiment. As illustrated in FIG. 30, the backside via 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 30, the backside power rails 284 are embedded in one or more dielectric layers, and the backside interconnect 286 includes wires and vias embedded in one or more dielectric layers. In some embodiment, the backside power rails 284 are considered part of the backside interconnect 286. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance. The operation 150 may perform further fabrication processes to the device 200. For example, it may form passivation layers on the backside of the device 200, remove the carrier 370, and perform other BEOL processes. FIG. 31 illustrates the device 200, in portion, after the carrier 370 is removed.

Although not intended to be limiting, embodiments of the present disclosure provide one or more of the following advantages. For example, embodiments of the present disclosure provide stacked CMOS structures with a first transistor stacked on a second transistor where the first and the second transistors have different conductivities. This greatly reduces the footprint of the CMOS structure compared with approaches where the first and the second transistors are implemented side-by-side. This enables further scaling down the integrated circuits. Embodiments of the present disclosure can be readily integrated into existing semiconductor manufacturing processes.

In one example aspect, the present disclosure is directed to a semiconductor structure that includes a power rail; a first source/drain feature disposed over the power rail; a via connecting the power rail to the first source/drain feature; an isolation feature disposed over the first source/drain feature; and a second source/drain feature disposed over the isolation feature, where the first and the second source/drain features are of opposite conductivity types.

In some embodiments of the semiconductor structure, the first source/drain feature is of p-type and the second source/drain feature is of n-type. In some embodiments, the semiconductor structure further includes a third source/drain feature disposed over the power rail; a fourth source/drain feature disposed over the third source/drain feature; a first channel layer connecting the first and the third source/drain features; a second channel layer over the first channel layer and connecting the second and the fourth source/drain features; and a gate structure engaging both the first and the second channel layers. In a further embodiment, the semiconductor structure further includes a second isolation feature disposed between the third source/drain feature and the fourth source/drain feature. In some embodiments, the third source/drain feature directly contacts the fourth source/drain feature. In a further embodiment, the semiconductor structure further includes a second power rail disposed over the fourth source/drain feature; and a second via connecting the second power rail to the fourth source/drain feature. In an embodiment, the semiconductor structure further includes a second via disposed over and connecting to the second source/drain feature.

In another example aspect, the present disclosure is directed to a method that includes providing a structure having a substrate, a fin having a stack of first and second semiconductor layers alternately stacked over the substrate, a sacrificial gate structure over the fin, and gate spacers on sidewalls of the sacrificial gate structure. The method further includes etching the fin adjacent to the gate spacers to form first and second source/drain trenches; laterally recessing the second semiconductor layers exposed in the first and the second source/drain trenches to form gaps; forming inner spacers in the gaps; epitaxially growing first and second source/drain features in the first and the second source/drain trenches respectively; partially removing the first and the second source/drain features; after the partially removing, forming a hard mask covering the second source/drain feature and exposing the first source/drain feature; with the hard mask in place, depositing an isolation material over the first source/drain feature; removing the hard mask; and epitaxially growing a third source/drain feature over the isolation material and a fourth source/drain feature over the second source/drain feature, wherein the first and the second source/drain features are of a first conductivity type, and the third and the fourth source/drain features are of a second conductivity type opposite to the first conductivity type.

In an embodiment, before the epitaxially growing of the first and the second source/drain features, the method further includes performing an extra etching to the first source/drain trench; and after the performing of the extra etching, depositing a dummy material into the first source/drain trench, wherein the first source/drain feature is grown over the dummy material. In a further embodiment, the method further includes removing the dummy material from a backside of the structure to form a backside via hole; and forming a via in the backside via hole.

In some embodiments, the method further includes replacing the sacrificial gate structure with a high-k metal gate. In a further embodiment, the replacing includes removing the sacrificial gate structure to form a gate trench; removing the second semiconductor layers exposed in the gate trench; depositing a high-k gate dielectric layer over each of the first semiconductor layers exposed in the gate trench; and depositing a metal gate electrode over the high-k gate dielectric layer.

In yet another example aspect, the present disclosure is directed to a method that includes providing a structure having a substrate and first, second, and third regions over the substrate, the third region having a stack of first and second semiconductor layers alternately stacked over the substrate. The method further includes etching source/drain trenches in each of the first, the second, and the third regions, wherein the source/drain trenches in the third region are etched into the stack of the first and the second semiconductor layers; forming a first hard mask covering the first region and exposing the second and the third regions; and with the first hard mask in place, epitaxially growing a first type of source/drain features in the source/drain trenches in the second and the third regions. The method further includes forming a second hard mask covering the second region and exposing the third region; with the first and the second hard masks in place, partially recessing the source/drain features in the third region; after the partially recessing, forming a third hard mask exposing a first one of the source/drain features in the third region and covering a second one of the source/drain features in the third region; and with the first, the second, and the third hard masks in place, depositing an isolation material over the first one of the source/drain features in the third region.

In an embodiment, the method further includes removing the first and the third hard masks; and with the second hard mask in place, forming a second type of source/drain features in the source/drain trenches in the first region, over the isolation material, and over the second one of the source/drain features in the third region, wherein the first and the second types are of opposite conductivity. In a further embodiment, the first type is of p-type conductivity and the second type is of n-type conductivity. In another embodiment, the method further includes, after the forming of the second type of source/drain features, removing the second hard mask.

In an embodiment, each of the first and the second regions also has a stack of the first and the second semiconductor layers and the source/drain trenches in the first and the second regions are also etched into the stack of the first and the second semiconductor layers. In another embodiment, after the etching of the source/drain trenches and before the forming of the first hard mask, the method further includes performing an extra etching to one of the source/drain trenches in the third region; and depositing a sacrificial semiconductor layer in the one of the source/drain trenches, wherein the first one of the source/drain features in the third region is grown on top of the sacrificial semiconductor layer. In a further embodiment, the method further includes thinning down the substrate from a backside of the structure to expose the sacrificial semiconductor layer; removing the sacrificial semiconductor layer to form a via hole; and forming a via in the via hole. In an embodiment, at least one of the first semiconductor layers connects the first and the second ones of the source/drain features in the third region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first source/drain feature;
an isolation feature disposed over the first source/drain feature;
a second source/drain feature disposed over the isolation feature, where the first and the second source/drain features are of opposite conductivity types;
a third source/drain feature;
a fourth source/drain feature disposed over the third source/drain feature, wherein the third source/drain feature directly contacts the fourth source/drain feature, where the third and the fourth source/drain features are of opposite conductivity types;
a first channel layer connecting the first and the third source/drain features;
a second channel layer over the first channel layer and connecting the second and the fourth source/drain features; and
a gate electrode engaging both the first and the second channel layers.

2. The semiconductor structure of claim 1, wherein the first source/drain feature is of p-type and the second source/drain feature is of n-type.

3. The semiconductor structure of claim 2, wherein the third source/drain feature is of a p-type and the fourth source/drain feature is of an n-type.

4. The semiconductor structure of claim 1, wherein a bottom surface of the second source/drain feature disposed a first distance above a substrate and a bottommost surface of the fourth source/drain feature is disposed a second distance above the substrate, wherein the second distance is less than the first distance.

5. The semiconductor structure of claim 1, further comprising:
a power rail disposed over the fourth source/drain feature; and
a via connecting the power rail to the fourth source/drain feature.

6. The semiconductor structure of claim 1, wherein the third source/drain feature directly contacts the fourth source/drain feature at a curvilinear interface in a cross-sectional view.

7. The semiconductor structure of claim 1, further comprising:
a backside power rail.

8. A method, comprising:
providing a structure having a substrate, a fin having a stack of first and second semiconductor layers alternately stacked over the substrate, a sacrificial gate structure over the fin;
etching the fin adjacent to the sacrificial gate structures to form first and second source/drain trenches;

epitaxially growing first and second source/drain features in the first and the second source/drain trenches respectively;

partially removing the first and the second source/drain features;

while masking the second source/drain feature, depositing an isolation material over the first source/drain feature; and epitaxially growing a third source/drain feature over the isolation material and a fourth source/drain feature over the second source/drain feature, wherein the first and the second source/drain features are of a first conductivity type, and the third and the fourth source/drain features are of a second conductivity type opposite to the first conductivity type.

9. The method of claim 8, wherein before the epitaxially growing of the first and the second source/drain features, the method further comprises:

performing an extra etching to the first source/drain trench; and after performing the extra etching, depositing a dummy material into the first source/drain trench, wherein the first source/drain feature is grown over the dummy material.

10. The method of claim 9, further comprising:

removing the dummy material from a backside of the structure to form a backside via hole; and forming a via in the backside via hole.

11. The method of claim 8, further comprising:

after epitaxially growing the third source/drain feature and the fourth source/drain feature, replacing a sacrificial gate structure with a high-k metal gate.

12. The method of claim 8, wherein epitaxially growing the fourth source/drain feature over the second source/drain feature includes growing the fourth source/drain feature directly on the second source/drain feature.

13. A method, comprising:

forming a first source/drain trench and a second source/drain trench, wherein a channel layer interposes the first and second source/drain trenches;

epitaxially growing a first type of source/drain feature in the first and second source/drain trenches to form a first source/drain feature in the first source/drain trench and a second source/drain feature in the second source/drain trench;

depositing an isolation material over the first source/drain feature, the second source/drain trench being free of the deposited isolation material; and growing epitaxial material of a second type over the isolation material in the first source/drain trench and over the second source/drain feature in the second source/drain trench.

14. The method of claim 13, wherein the first source/drain trench and a second source/drain trench includes epitaxially growing material adjacent the channel layer and a sacrificial semiconductor layer disposed on the channel layer, an inner spacer interposing the sacrificial semiconductor layer and the first source/drain trench.

15. The method of claim 14, wherein the first type is of p-type conductivity and the second type is of n-type conductivity.

16. The method of claim 13, wherein the growing the epitaxial material over the second source/drain feature in the second source/drain trench includes the epitaxial material directly interfacing the second source/drain feature.

17. The method of claim 16, wherein the growing the epitaxial material over the isolation material includes the epitaxial material directly interfacing the isolation material.

18. The method of claim 16, wherein the growing the epitaxial material directly interfacing the second source/drain feature forms a common source or common drain region with the second source/drain feature.

19. The method of claim 13, further comprising:

forming another channel layer extending between the grown epitaxial material over the isolation material in the first source/drain trench and the grown epitaxial material over the second source/drain feature in the second source/drain trench.

20. The method of claim 19, wherein the isolation material is free from an interface with the channel layer and free from an interface with another channel layer.

* * * * *